(12) United States Patent
Yoshida

(10) Patent No.: US 11,262,629 B2
(45) Date of Patent: Mar. 1, 2022

(54) ACTIVE MATRIX SUBSTRATE AND LIQUID CRYSTAL DISPLAY APPARATUS

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 308 days.

(21) Appl. No.: 16/483,462

(22) PCT Filed: Jan. 26, 2018

(86) PCT No.: PCT/JP2018/002533
§ 371 (c)(1),
(2) Date: Aug. 5, 2019

(87) PCT Pub. No.: WO2018/143098
PCT Pub. Date: Aug. 9, 2018

(65) Prior Publication Data
US 2021/0286219 A1    Sep. 16, 2021

(30) Foreign Application Priority Data
Feb. 6, 2017    (JP) .............................. JP2017-019624

(51) Int. Cl.
*G02F 1/1362*    (2006.01)
*G02F 1/1368*    (2006.01)

(52) U.S. Cl.
CPC ...... *G02F 1/136213* (2013.01); *G02F 1/1368* (2013.01); *G02F 1/13629* (2021.01); *G02F 1/136227* (2013.01)

(58) Field of Classification Search
CPC ........... G02F 1/136213; G02F 1/13629; G02F 1/136227
See application file for complete search history.

(56) References Cited

U.S. PATENT DOCUMENTS 6,028,577 A     2/2000 Sakamoto
2007/0097072 A1 5/2007 Kim et al.
(Continued)

FOREIGN PATENT DOCUMENTS

| CN | 101770125 A | 7/2010 |
|---|---|---|
| CN | 103250199 A | 8/2013 |

(Continued)

*Primary Examiner* — Lucy P Chien
(74) *Attorney, Agent, or Firm* — Keating & Bennett, LLP

(57) ABSTRACT

An active matrix substrate includes a gate metal layer, a source metal layer, an interlayer insulating layer, a first transparent conductive layer and second transparent conductive layer formed on or above the interlayer insulating layer, and a lower metal layer formed below the gate metal layer. The lower metal layer includes a plurality of CS bus lines each extending in a column direction and not overlapping a plurality of source bus lines. Each of the plurality of pixels has a drain extension section extending from a drain electrode, a first transparent electrode, a second transparent electrode connected to the drain extension section, and an auxiliary capacitor electrode that includes the lower metal layer and/or the gate metal layer, is electrically connected to at least any one of the plurality of CS bus lines, and overlaps the drain extension section when viewed in a normal direction of the substrate.

20 Claims, 21 Drawing Sheets

(56) References Cited

U.S. PATENT DOCUMENTS

| | | |
|---|---|---|
| 2012/0138922 A1 | 6/2012 | Yamazaki et al. |
| 2013/0250226 A1 | 9/2013 | Yoshida et al. |
| 2013/0320334 A1 | 12/2013 | Yamazaki et al. |
| 2014/0286076 A1 | 9/2014 | Aoki et al. |
| 2017/0003561 A1* | 1/2017 | Yonekura .......... G02F 1/136213 |

FOREIGN PATENT DOCUMENTS

| | | |
|---|---|---|
| JP | 10-206869 A | 8/1998 |
| JP | 2007-128092 A | 5/2007 |
| JP | 2012-134475 A | 7/2012 |
| JP | 2014-007399 A | 1/2014 |
| JP | 2014-209727 A | 11/2014 |

\* cited by examiner

FIG. 6
(a)
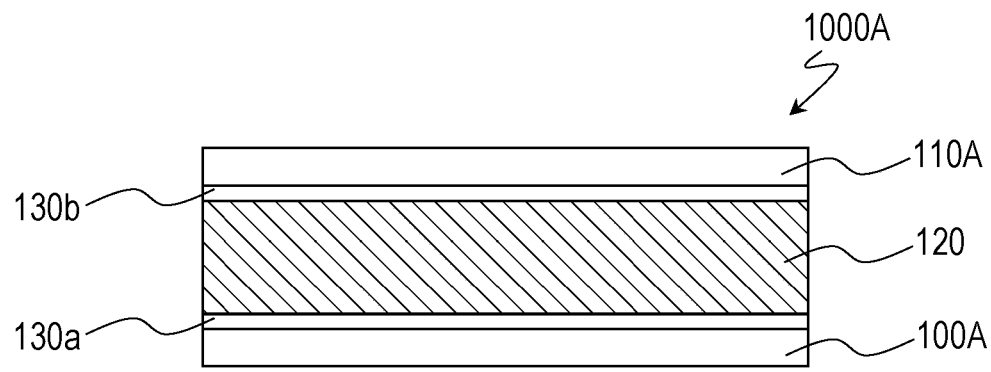
(b)
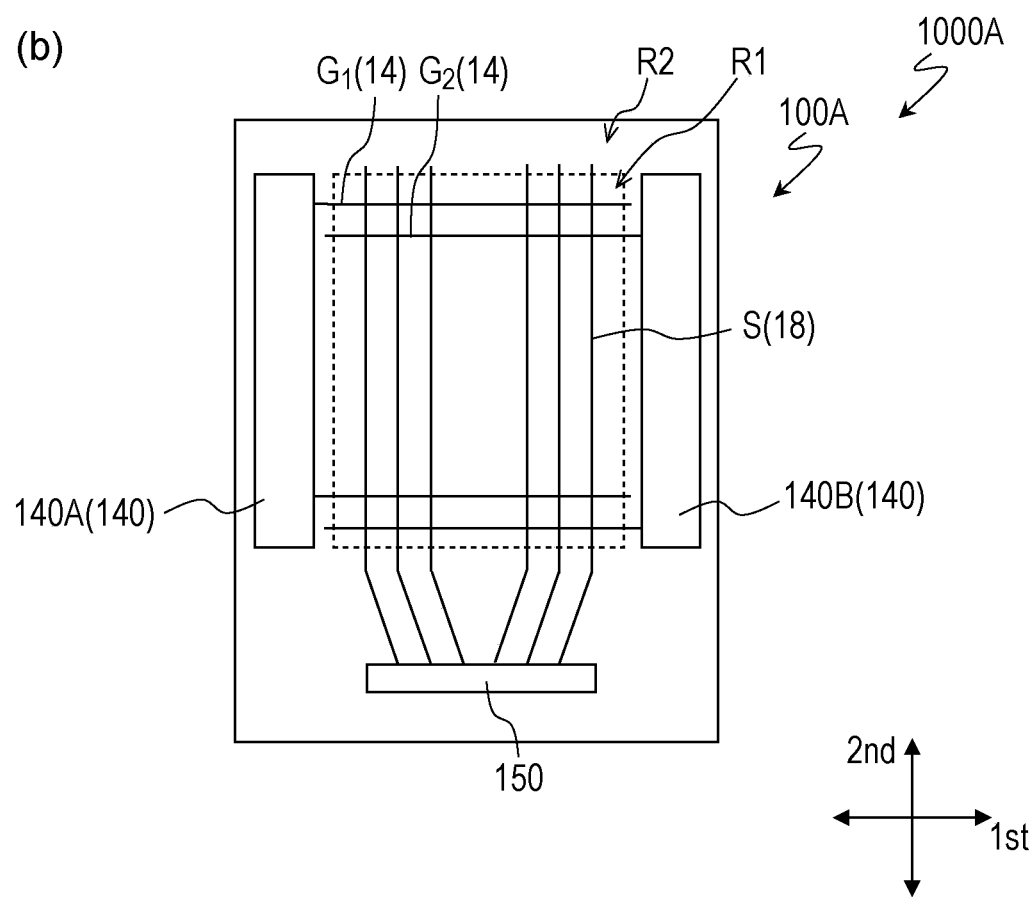

FIG. 10
(a)
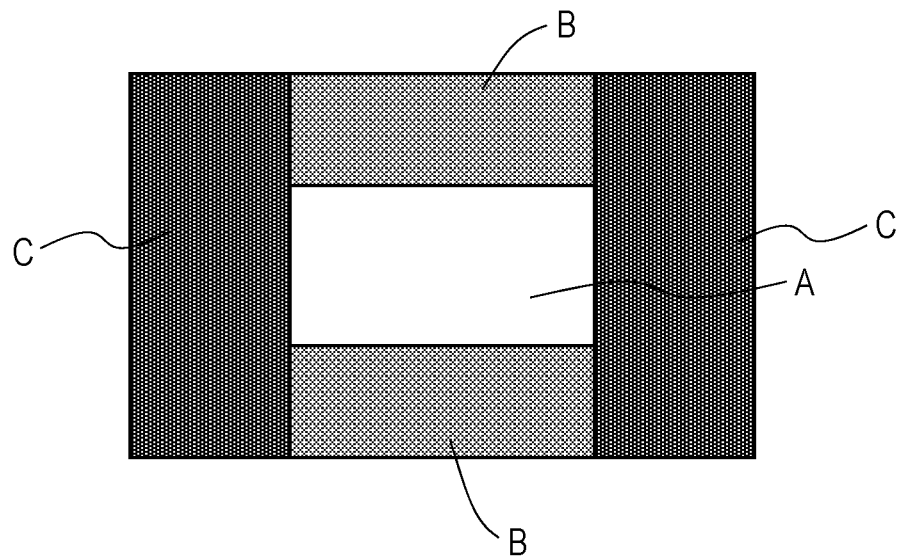
(b)
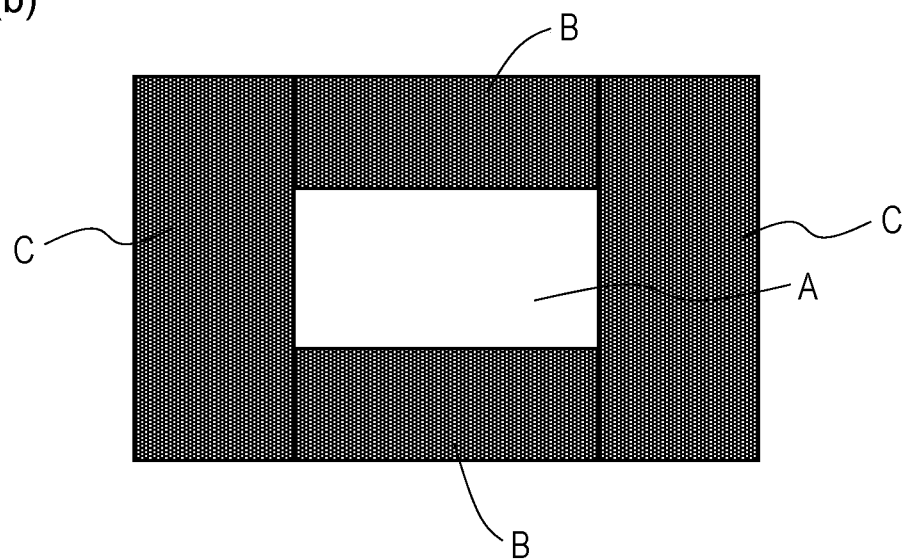

ACTIVE MATRIX SUBSTRATE AND LIQUID CRYSTAL DISPLAY APPARATUS

TECHNICAL FIELD

The present invention relates to an active matrix substrate and a liquid crystal display apparatus including the active matrix substrate.

BACKGROUND ART

A liquid crystal display apparatus including an active matrix substrate is currently used in various applications. In recent years, high resolution of an active-matrix liquid crystal display apparatus has been advanced. In addition, a demand for a picture-frame narrowing and a manufacturing cost reduction is also increasing.

The liquid crystal display apparatus including the active matrix substrate has a plurality of pixels arranged in a matrix having a plurality of rows and a plurality of columns, and on the active matrix substrate, a switching element (for example, a thin film transistor (TFT)) is provided for each pixel. Typically, the active-matrix liquid crystal display apparatus has a configuration that one gate bus line (a scanning line) is provided for each pixel row, and one source bus line (a signal line) is provided for each pixel column. Each gate bus line is supplied with a scan signal voltage (also referred to as a gate signal voltage) from a gate drive circuit (hereinafter, referred to as a "gate driver"), and each source bus line is supplied with a display signal voltage (also referred to as a source signal voltage or a gray-scale voltage) from a source drive circuit (hereinafter referred to as a "source driver").

PTL 1 and PTL 2 disclose an active-matrix liquid crystal display apparatus having a structure referred to as a "dual gate drive structure". In the liquid crystal display apparatus in PTL 1 and PTL 2, two gate bus lines (a first gate bus line and a second gate bus line) are provided so as to correspond to each pixel row, and each source bus line is provided so as to correspond to two pixel columns. Each source bus line is connected to a pixel connected to the first gate bus line and a pixel connected to the second gate bus line, in each pixel row. Such a configuration is referred to herein as the "dual gate drive structure" in the specification of the present application. In addition, with respect to the dual gate drive structure, the above-described structure in the related art (one gate bus line is provided for each pixel row and one source bus line is provided for each pixel column) may be referred to as a "single gate drive structure". A liquid crystal display apparatus having the dual gate drive structure can reduce the number of the source bus lines and the source drivers (for example, by approximately a half) as compared to a liquid crystal display apparatus having the single gate drive structure. In general, since the source driver is more expensive than the gate driver, the liquid crystal display apparatus having the dual gate drive structure can reduce the manufacturing cost. In addition, the liquid crystal display apparatus having the dual gate drive structure contributes to the picture-frame narrowing and a miniaturization.

In the specification of the present application, the "dual gate drive structure" and the "single gate drive structure" may be used to indicate a configuration of the active matrix substrate included in the liquid crystal display apparatus.

CITATION LIST

Patent Literature

PTL 1: Japanese Unexamined Patent Application Publication No. 2007-128092

PTL 2: Japanese Unexamined Patent Application Publication No. 10-206869

SUMMARY OF INVENTION

Technical Problem

When a dual gate drive structure is applied to a high resolution liquid crystal display apparatus, a display quality may not be sufficiently obtained.

As the high resolution of the liquid crystal display apparatus has been advanced, a charging time for each pixel becomes short. In addition, as each pixel becomes small, a capacitance value of a parasitic capacitance with respect to a capacitance value of a pixel capacitor relatively increases. When the dual gate drive structure is applied, the charging time for each pixel becomes further short (for example, approximately a half), and the capacitance value of the parasitic capacitance with respect to the capacitance value of the pixel capacitor further increases. This is because, for example, when a switching element is enlarged to compensate for the short charging time, an electrode constituting the switching element is enlarged, and thus the parasitic capacitance increases. As described above, in the high resolution liquid crystal display apparatus having the dual gate drive structure, a flicker or a shadowing easily occurs. Details will be described below.

Further, a problem that the flicker or the shadowing easily occurs is not limited to the liquid crystal display apparatus having the dual gate drive structure. The same problem may occur in an active-matrix liquid crystal display apparatus in which N (N is an integer of 2 or more) gate bus lines are provided so as to correspond to each pixel row. Such a liquid crystal display apparatus is generalized one of the liquid crystal display apparatus (in a case of N=2) having the dual gate drive structure. Each source bus line is provided so as to correspond to at least N pixel columns (for example, N pixel columns) including N pixels connected to each of N gate bus lines included in each pixel row. In the present specification, such a configuration is referred to as a "multiple gate drive structure". The multiple gate drive structure includes the dual gate drive structures.

The present invention has been made in view of the above problems, and an object thereof is to provide an active matrix substrate capable of improving a display quality while suppressing a decrease in aperture ratio of a liquid crystal display apparatus having a multiple gate drive structure (for example, a dual gate drive structure).

Solution to Problem

According to an embodiment of the present invention, there is provided an active matrix substrate that has a plurality of pixels arranged in a matrix having a plurality of rows and a plurality of columns. The active matrix substrate includes: a plurality of first TFTs each associated with any one of the plurality of pixels; a plurality of gate bus lines each extending in a row direction; and a plurality of source bus lines each extending in a column direction. The plurality of gate bus lines include a first gate bus line and a second gate bus line associated with each of the plurality of pixel rows. In each of the plurality of pixel rows, when a pixel associated with the first gate bus line is set as a first pixel, and the pixel associated with the second gate bus line is set as a second pixel, each of the plurality of source bus lines is associated with at least two pixel columns including the first pixel and the second pixel included in each of the plurality of pixel rows. The active matrix substrate further includes: a substrate; a gate metal layer that is supported by the substrate and includes, out of a first gate electrode, a first source electrode, and a first drain electrode included in the plurality of first TFTs, the first gate electrode, and the plurality of gate bus lines; a gate insulating layer formed on the gate metal layer; a source metal layer that is formed on the gate insulating layer and includes the first source electrode, the first drain electrode, and the plurality of source bus lines; an interlayer insulating layer formed on the source metal layer; a first transparent conductive layer formed on the interlayer insulating layer; an inorganic insulating layer formed on the first transparent conductive layer; a second transparent conductive layer formed on the inorganic insulating layer; a lower metal layer formed below the gate metal layer; and a lower insulating layer formed between the gate metal layer and the lower metal layer. The lower metal layer includes a plurality of CS bus lines each extending in the column direction, the plurality of CS bus lines not overlapping the plurality of source bus lines when viewed in a normal direction of the substrate. Each of the plurality of pixels has a drain extension section that is included in the source metal layer and that extends from the first drain electrode, a first transparent electrode included in the first transparent conductive layer, a second transparent electrode that is included in the second transparent conductive layer and is connected to the drain extension section, and an auxiliary capacitor electrode that includes the lower metal layer and/or the gate metal layer, is electrically connected to at least any one of the plurality of CS bus lines, and overlaps the drain extension section when viewed in the normal direction of the substrate.

In a certain embodiment, the plurality of CS bus lines are electrically connected to the first transparent conductive layer.

In a certain embodiment, in the lower insulating layer, the gate insulating layer, and the interlayer insulating layer, a plurality of contact holes each reaching any one of the plurality of CS bus lines are formed, and the first transparent conductive layer is in contact with the plurality of CS bus lines in the plurality of contact holes.

In a certain embodiment, the plurality of contact holes include a contact hole formed between the first gate bus line associated with a certain pixel row and the second gate bus line associated with a pixel row adjacent to the certain pixel row.

In a certain embodiment, the plurality of contact holes are provided for every n pixel rows (n is an integer) in the column direction and every 2×n pixel columns in the row direction.

In a certain embodiment, each of the plurality of pixels further has a first opening that is formed in the interlayer insulating layer and reaches the drain extension section, and a second opening that is formed in the inorganic insulating layer and overlaps the first opening when viewed in the normal direction of the substrate, and the second transparent electrode is in contact with the drain extension section in the first opening.

In a certain embodiment, the drain extension section overlaps any one of the plurality of CS bus lines when viewed in the normal direction of the substrate.

In a certain embodiment, the auxiliary capacitor electrode and/or the plurality of CS bus lines include the lower metal layer and the gate metal layer, and in the auxiliary capacitor electrode, a portion that overlaps the drain extension section when viewed in the normal direction of the substrate includes the gate metal layer.

In a certain embodiment, the auxiliary capacitor electrode includes the lower metal layer and the gate metal layer, each of the plurality of pixels further has a third opening that is formed in the lower insulating layer and reaches the lower metal layer of the auxiliary capacitor electrode, and the gate metal layer of the auxiliary capacitor electrode is formed to cover the third opening.

In a certain embodiment, the plurality of CS bus lines include the lower metal layer and the gate metal layer.

In a certain embodiment, the active matrix substrate further includes a second TFT disposed in a region other than the plurality of pixels. The second TFT has a second semiconductor layer formed on the substrate, the lower insulating layer formed on the second semiconductor layer, a second gate electrode that is included in the gate metal layer and is formed to overlap the second semiconductor layer across the lower insulating layer, the gate insulating layer covering the second gate electrode, and a second source electrode and a second drain electrode that are included in the source metal layer and are connected to the second semiconductor layer.

In a certain embodiment, the lower metal layer further includes a lower light shielding section formed to cover at least a channel region of the second semiconductor layer when viewed in the normal direction of the substrate.

In a certain embodiment, the plurality of first TFTs have a first semiconductor layer formed on the gate insulating layer, the first semiconductor layer includes an oxide semiconductor, and the second semiconductor layer includes crystalline silicon.

According to another embodiment of the present invention, there is provided a liquid crystal display apparatus including the active matrix substrate according to any one of the embodiments described above, a counter substrate disposed to be opposite the active matrix substrate, and a liquid crystal layer provided between the active matrix substrate and the counter substrate.

In a certain embodiment, the second transparent electrode functions as a pixel electrode, and the counter substrate has a counter electrode opposite the second transparent electrode.

In a certain embodiment, the second transparent electrode has at least one slit, the second transparent electrode functions as a pixel electrode, and the first transparent electrode functions as a common electrode.

Advantageous Effects of Invention

According to the embodiments of the present invention, there is provided an active matrix substrate capable of improving a display quality while suppressing decrease in aperture ratio of a liquid crystal display apparatus having a multiple gate drive structure (for example, a dual drive structure).

BRIEF DESCRIPTION OF DRAWINGS

FIG. 4(a) is a view in which a lower metal layer 12 is hatched, FIG. 4(b) is a view in which a gate metal layer 14 and a source metal layer 18 are hatched, FIG. 4(c) is a view in which a second transparent conductive layer 22 is hatched, and FIG. 4(d) is a view in which a first transparent conductive layer 20 is hatched.

FIGS. 6(a) and 6(b) are views schematically illustrating a liquid crystal display apparatus 1000A including the active matrix substrate 100A.

FIGS. 10(a) and 10(b) are views for describing a shadowing in a normally black mode.

FIG. 18(a) is a view in which a gate metal layer 14 is hatched, and FIG. 18(b) is a view in which a lower metal layer 12 is hatched.

DESCRIPTION OF EMBODIMENTS

Hereinafter, embodiments of the present invention will be described with reference to the drawings. The present invention is not limited to the embodiments exemplified below. Hereinafter, as an active matrix substrate according to an embodiment of the present invention, an active matrix substrate used for a liquid crystal display apparatus will be exemplified. In the following drawings, components having substantially the same functions are denoted by the same reference symbols and the description thereof may be omitted.

Embodiment 1

Figure 1:
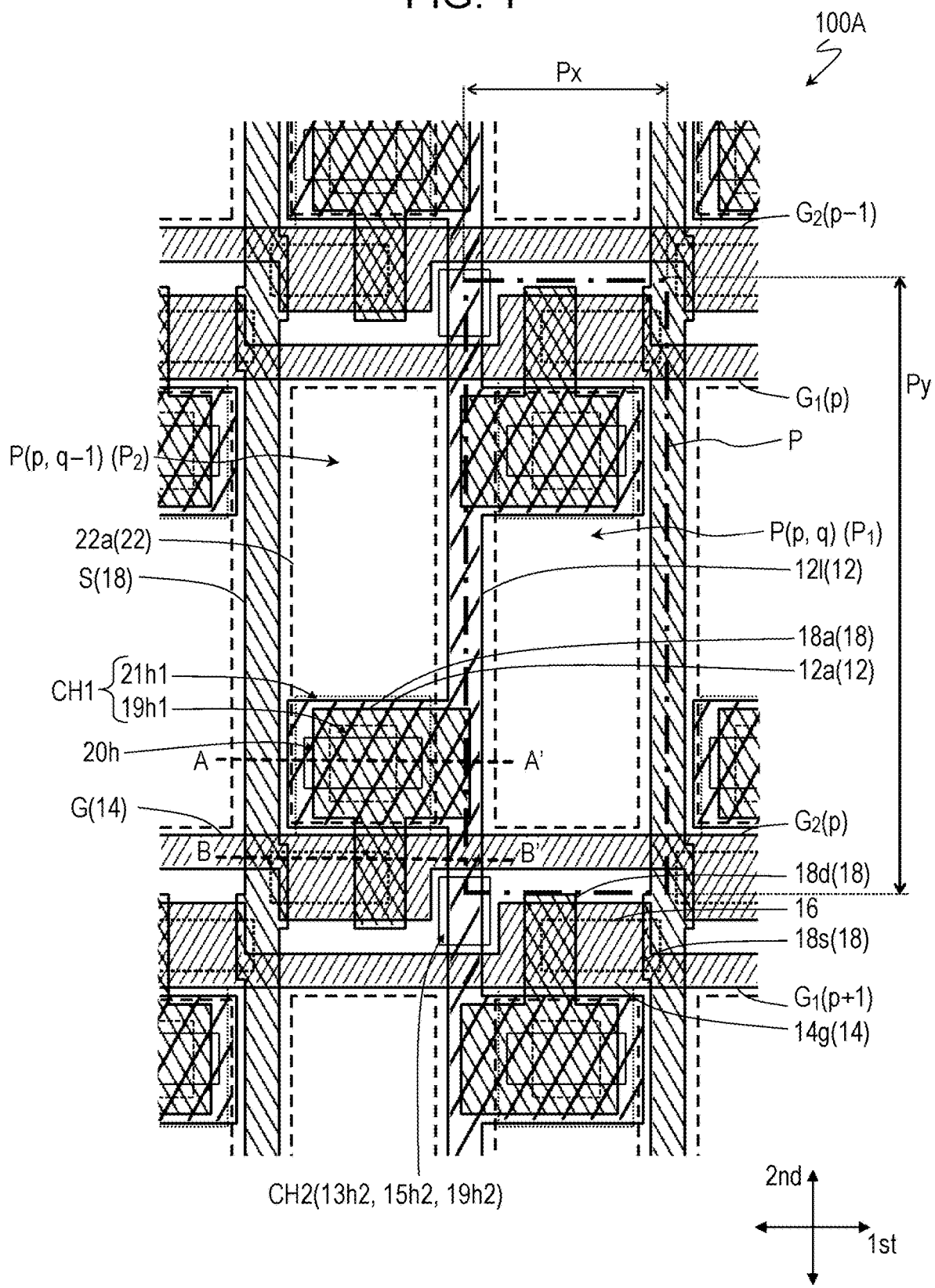
FIG. 1 is a plan view schematically illustrating an active matrix substrate 100A according to Embodiment 1 of the present invention.
Figure 2:
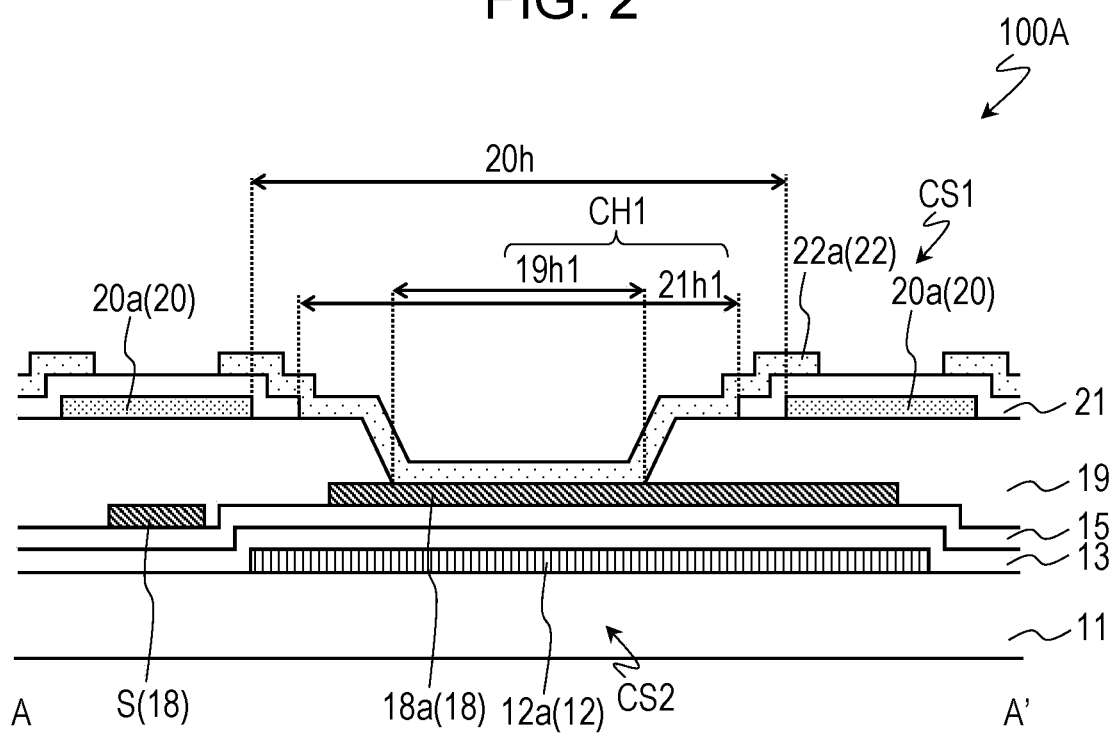
FIG. 2 is a sectional view schematically illustrating an active matrix substrate 100A, and illustrates a sectional structure taken along the line A-A' in FIG. 1.
Figure 3:
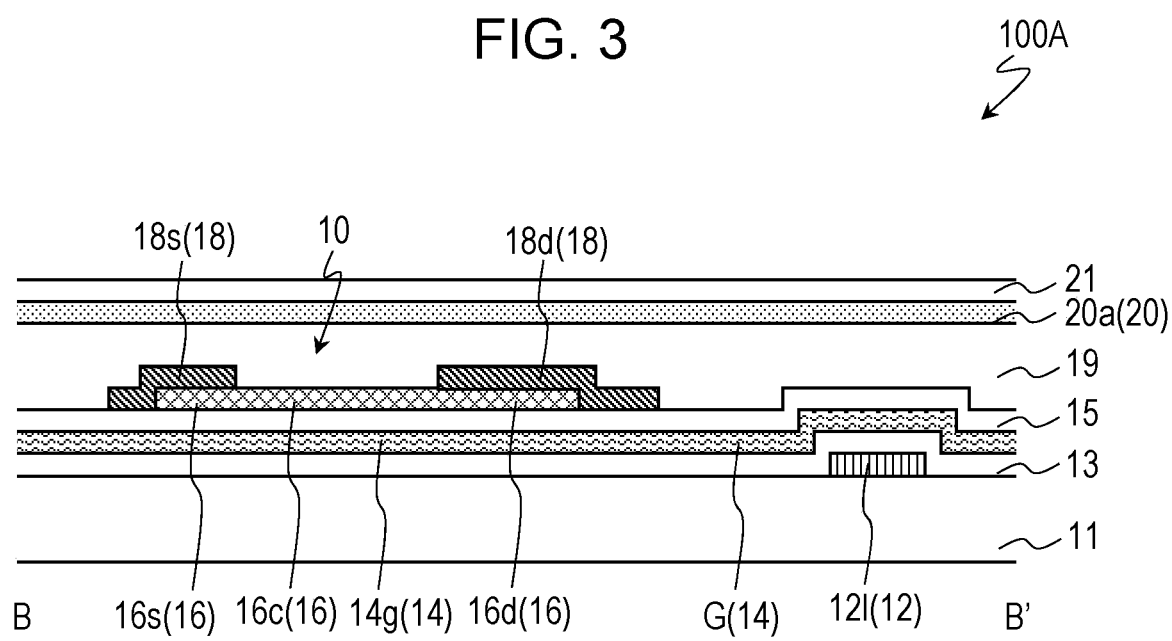
FIG. 3 is a sectional view schematically illustrating the active matrix substrate 100A, and illustrates a sectional structure taken along the line B-B' in FIG. 1.
Figure 4:
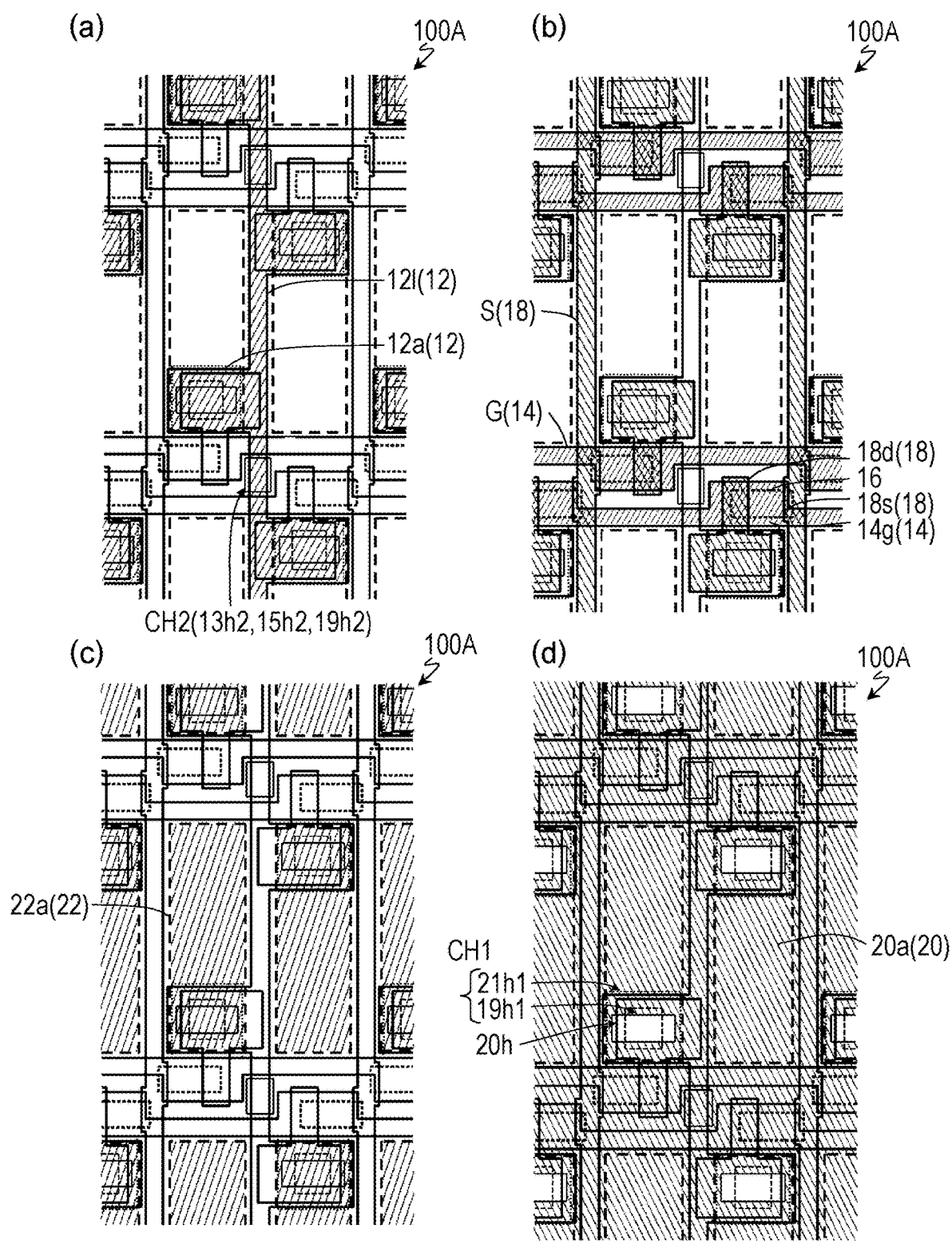
FIGS. 4(a) to 4(d) are plan views schematically illustrating the active matrix substrate 100A.

FIG. 1 to FIG. 4 illustrate an active matrix substrate 100A of the present embodiment. FIG. 1 is a plan view schematically illustrating the active matrix substrate 100A. FIGS. 2 and 3 are sectional views schematically illustrating the active matrix substrate 100A. FIG. 2 illustrates a sectional structure taken along the line A-A' in FIG. 1, and FIG. 3 illustrates a sectional structure taken along the line B-B' in FIG. 1. FIGS. 4(a) to 4(d) are plan views schematically illustrating the active matrix substrate 100A, FIG. 4(a) is a view in which a lower metal layer 12 is hatched, FIG. 4(b) is a view in which a gate metal layer 14 and a source metal layer 18 are hatched, FIG. 4(c) is a view in which a second transparent conductive layer 22 is hatched, and FIG. 4(d) is a view in which a first transparent conductive layer 20 is hatched.

The active matrix substrate 100A is suitably used, for example, for a liquid crystal display apparatus in a twisted nematic (TN) mode or a vertical alignment (VA) mode. For example, as described below with reference to FIG. 6(a), the liquid crystal display apparatus of the present embodiment has the active matrix substrate 100A, a counter substrate, and a liquid crystal layer provided between the active matrix substrate 100A and the counter substrate, and the counter substrate has a counter electrode opposite a pixel electrode 22a.

As illustrated in FIG. 1, the active matrix substrate 100A includes a plurality of regions P arranged in a matrix having a plurality of rows and a plurality of columns, a plurality of TFTs 10 (sometimes referred to as a "pixel TFT 10"), the pixel electrode 22a provided in each region P, a plurality of gate bus lines G each extending in a row direction (a first direction in FIG. 1), and a plurality of source bus lines S each extending in the column direction (a second direction in FIG. 1). Each of the plurality of regions P corresponds to each pixel of the liquid crystal display apparatus including the active matrix substrate 100A. In the specification of the present application, a region P of the active matrix substrate 100A corresponding to each pixel of the liquid crystal display apparatus is also referred to as the "pixel".

Each of the plurality of TFTs 10 is associated with any one of a plurality of pixels P. That is, the TFT 10 is provided so as to correspond to each pixel P. The TFT 10 has a gate electrode 14g, a source electrode 18s, and a drain electrode 18d. The gate electrode 14g of each TFT 10 is electrically connected to any one of the plurality of gate bus lines G, and the source electrode 18s of each TFT 10 is electrically connected to any one of the plurality of source bus lines S. Each gate bus line G is supplied with a scan signal voltage from a gate driver (not shown), and each source bus line S is supplied with a display signal voltage from a source driver (not shown). The drain electrode 18d of each TFT 10 is electrically connected to the pixel electrode 22a provided in each pixel P.

The pixel P includes a pixel opening that actually contributes to a display, and has a size (Px×Py) determined by an arrangement pitch of the pixel P (a pitch in the row direction is Px and a pitch in the column direction is Py). The pixel P can be considered as, for example, a region surrounded by a dashed line in FIG. 1. Although the TFT 10, the gate bus line G, and the source bus line S for driving the pixel P are not components of the pixel P, the TFT 10, the gate bus line G, and the source bus line S for driving the pixel P, are expressed to be "associated with the pixel P" to express a relationship with the pixel P. For example, an expression that "a certain TFT 10 is associated with a certain pixel P" means that "a drain electrode 18d of the certain TFT 10 is electrically connected to a pixel electrode 22a included in the certain pixel P". An expression that "a certain gate bus line G is associated with a certain pixel P" means that the certain gate bus line G is connected to a gate electrode 16g of the TFT 10 associated with the certain pixel P. An expression that "a certain source bus line S is associated with a certain pixel P" means that the certain source bus line S is connected to the source electrode 18s of the TFT 10 associated with the certain pixel P.

The gate bus line G and the source bus line S may be expressed in relationship to the pixel row and the pixel column, respectively. An expression that "a certain gate bus line G is associated with a certain pixel row" means that the certain gate bus line G is connected to the gate electrode 16g of the TFT 10 associated with at least one pixel P of the pixels P that are included in the certain pixel row. An expression that "a certain source bus line S is associated with a certain pixel column" means that the certain source bus line S is connected to the source electrode 18s of the TFT 10 associated with at least one pixel P of the pixels P that are included in the certain pixel column.

Figure 5:
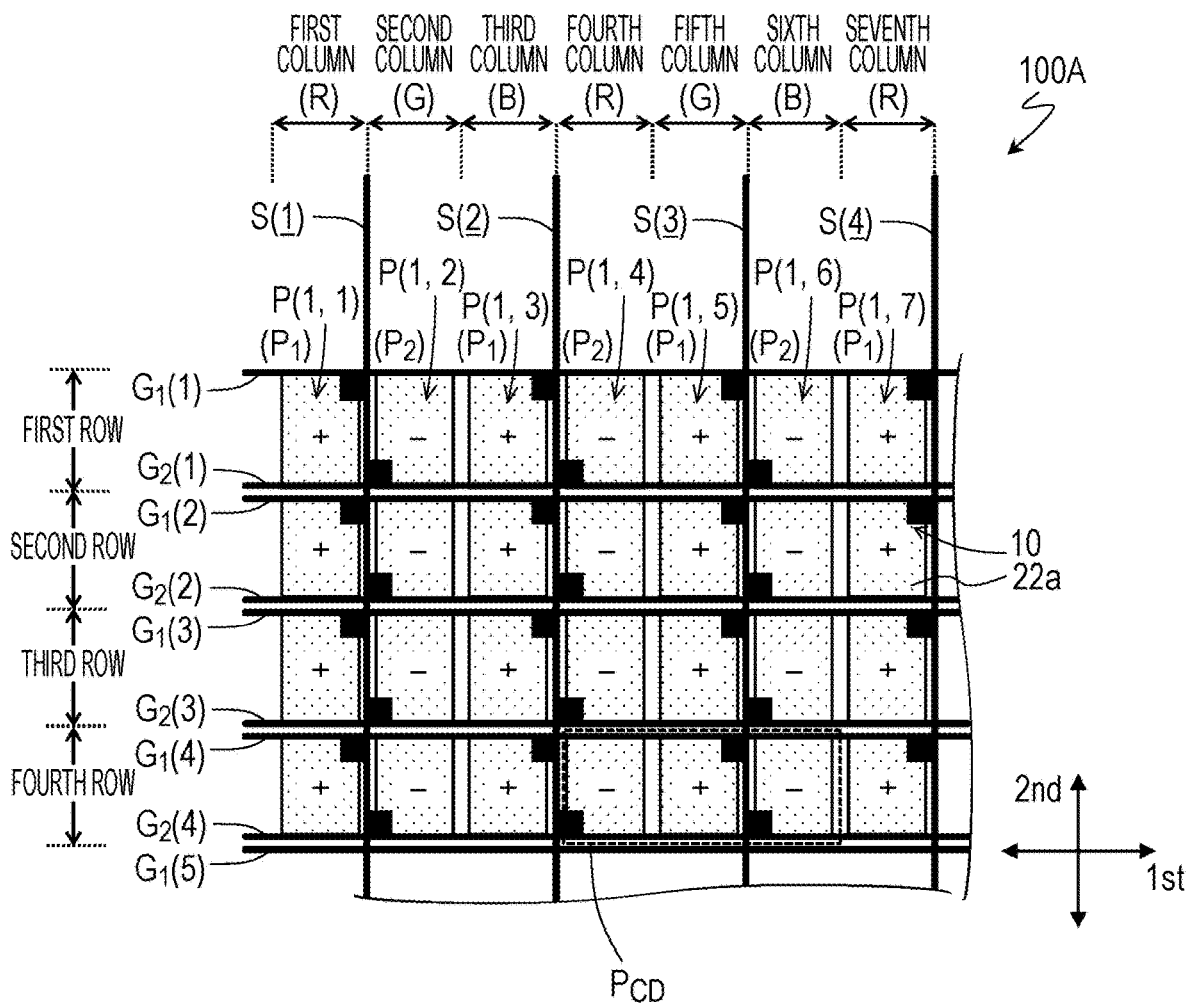
FIG. 5 is a view for describing an electric connection relationship between a TFT 10, a gate bus line G, and a source bus line S in each pixel P of the active matrix substrate 100A.

The active matrix substrate 100A has a dual gate drive structure. The dual gate drive structure will be described with reference to FIG. 5. FIG. 5 is a view for describing an electric connection relationship between the TFT 10, the gate bus lines G, and the source bus line S in each pixel P of the active matrix substrate 100A. FIG. 5 also illustrates a polarity of the display signal voltage applied to each pixel in a certain vertical scanning period in a case where the liquid crystal display apparatus including the active matrix substrate 100A is driven using various signal voltages illustrated in FIG. 9. A method of driving the liquid crystal display apparatus including the active matrix substrate 100A will be described below with reference to FIG. 9.

The plurality of pixels P are arranged in a matrix (rp×q) having rp rows and cq columns. A pixel in a p-th row and a q-th column (where $1 \leq p \leq rp$, $1 \leq q \leq cq$) may be denoted as a pixel P (p, q).

The plurality of gate bus lines G include two gate bus lines associated with each of the plurality of pixel rows. As illustrated in FIG. 5, two gate bus lines G (a first gate bus line $G_1$ and a second gate bus line $G_2$) are provided so as to correspond to each of the plurality of pixel rows. The first gate bus line $G_1$ and the second gate bus line $G_2$ may be collectively referred to as a gate bus line G. The first gate bus line $G_1$ and the second gate bus line $G_2$ associated with the p-th pixel row may be denoted as a first gate bus line $G_1(p)$ and a second gate bus line $G_2(p)$.

In each pixel row, a pixel associated with the first gate bus line $G_1$ may be referred to as a first pixel $P_1$, and a pixel associated with the second gate bus line $G_2$ may be referred to as a second pixel $P_2$. An expression that "a certain pixel P is associated with a certain gate bus line G" means that the gate electrode 16g of the TFT 10 associated with the certain pixel P is connected to the certain gate bus line G. As illustrated in FIGS. 1 and 5, here, in the assumption that the column direction is an up and down direction, the first gate bus line $G_1$ and the second gate bus line $G_2$ associated with each pixel row are respectively provided on a lower side and an upper side of the pixel row. That is, for a certain pixel row, the first gate bus line $G_1$ associated with the certain pixel row is disposed on an opposite side of the second gate bus line $G_2$ associated with the pixel row with the pixel electrode 22a of the certain pixel row interposed therebetween.

Each of the plurality of source bus lines S is associated with at least two pixel columns including the first pixel $P_1$ and the second pixel $P_2$ included in each of the plurality of pixel rows. In the example illustrated in FIG. 5, each of the plurality of source bus lines S is associated with the two pixel columns. Each of source bus line S may be denoted as a source bus line S(Q) by a sequential numbering from the left (here, $1 \leq Q \leq cq/2$). For example, a source bus line S(1) is associated with the first and second pixel columns. Specifically, the source bus line S(1) is connected to the TFTs 10 of the first pixel P(1, 1) and the second pixel P(1, 2) in the first row, and is connected to the TFTs 10 of the first pixel P(2, 1) and the second pixel P(2, 2) in the second row. The same applies to the following pixel rows.

In the example, each of the plurality of source bus lines S is connected to the TFTs 10 of two pixels P adjacent to each other in the row direction in each pixel row. In the example, the source bus line S(Q) is connected to the TFT 10 of the first pixel P(p, 2×Q−1) and the second pixel P(p, 2×Q) in the p-th pixel row. The source bus line S(Q) is associated with the (2×Q−1)-th pixel column and (2×Q)-th pixel column. Further, the present embodiment is not limited to the illustrated example, and the electric connection relationship between the TFT 10, the gate bus line G, and the source bus line S may be appropriately modified.

Further, the active matrix substrate and the liquid crystal display apparatus of the present embodiment are not limited to those having the dual gate drive structure, and may have a multiple gate drive structure. That is, N (N is an integer of 2 or more) gate bus lines may be provided so as to correspond to each pixel row, and each source bus line may be associated with the plurality of pixel columns (for example, the N pixel columns) including the N pixels which are each included in the plurality of pixel rows and are each associated with the N gate bus lines. Each source bus line is provided for each N pixel column, for example.

As illustrated in FIG. 5, in the liquid crystal display apparatus including the active matrix substrate 100A, for example, R, G, and B pixels arranged in the row direction constitute one color display pixel $P_{CD}$, and an R pixel column, a G pixel column, and a B pixel column are arranged in a stripe shape (that is, different colors are displayed for each pixel column). The color display pixel is not limited to the above-described example, and in addition to a red (R) pixel, a green (G) pixel, and a blue (B) pixel, may be constituted by at least one other color pixel (a yellow (Y) pixel, a cyan (C), a magenta (M) pixel, or white (W) pixel).

The structure of the active matrix substrate 100A will be described more specifically.

As illustrated in FIGS. 2 and 3, the active matrix substrate 100A has the gate metal layer 14, a gate insulating layer 15, a semiconductor layer 16, the source metal layer 18, an interlayer insulating layer 19, the first transparent conductive layer 20, an inorganic insulating layer 21, the second transparent conductive layer 22, the lower metal layer 12, and a lower insulating layer 13.

The gate metal layer 14 is formed on or above a substrate 11. The gate metal layer 14 includes the gate electrodes 14g of the plurality of TFTs 10 and the plurality of gate bus lines G. The gate metal layer 14 may have a single-layer structure or a stacked structure in which a plurality of layers are stacked. The gate metal layer 14 includes at least a layer formed of the metal material. In a case where the gate metal layer 14 has the stacked structure, some layers may be formed of a metal nitride or a metal oxide. The gate metal layer 14 is made of, for example, any of the metal such as aluminum (Al), tungsten (W), molybdenum (Mo), tantalum (Ta), chromium (Cr), titanium (Ti), and copper (Cu), an alloy containing the above described metal, and the nitride thereof.

The gate insulating layer 15 is formed on the gate metal layer 14. That is, the gate insulating layer 15 is formed to cover the gate electrode 14g and the gate bus line G. The gate insulating layer 15 is formed of an inorganic insulation material. The gate insulating layer 15 is, for example, a silicon oxide (SiOx) film, a silicon nitride (SixNy) film, a silicon oxynitride (SiOxNy; x>y) film, a silicon nitride oxide (SiNxOy; x>y) film, or the stacked film thereof.

The semiconductor layer 16 is formed on the gate insulating layer 15 and includes an active layer of the TFT 10.

The semiconductor layer 16 may be, for example, an amorphous silicon layer, a crystalline silicon layer, or an oxide semiconductor layer. A crystalline silicon layer may be, for example, a polysilicon layer.

The semiconductor layer 16 includes a channel region (also referred to as an "active region") 16c, a source region (also referred to as a "source contact region") 16s, and a drain region (also referred to as a "drain contact region") 16d. The source region 16s is a portion in contact with the source electrode 18s in the semiconductor layer 16, and the drain region 16d is a portion in contact with the drain electrode 18d in the semiconductor layer 16. The channel region 16c is a region positioned between the source region 16s and the drain region 16d. The channel region 16c is, for example, a portion in the semiconductor layer 16, overlapping the gate electrode 14g with the gate insulating layer 15 interposed therebetween.

The source metal layer 18 is formed on the gate insulating layer 15. The source metal layer 18 includes the source electrode 18s and the drain electrode 18d of the TFT 10, and the plurality of source bus lines S. The source metal layer 18 further includes a drain extension section 18a extending from the drain electrode 18d. Each pixel P has the TFT 10 and the drain extension section 18a (that is, the TFT 10 and the drain extension section 18a are provided in each pixel P). The source metal layer 18 may have a single layer structure or a stacked structure in which a plurality of layers are stacked. The source metal layer 18 includes at least the layer formed of the metal material. In a case where the source metal layer 18 has the stacked structure, some layers may be formed of the metal nitride or the metal oxide. The source metal layer 18 is made of, for example, any of the metal such as aluminum (Al), tungsten (W), molybdenum (Mo), tantalum (Ta), chromium (Cr), titanium (Ti), and copper (Cu), the alloy containing the above described metal, and the nitride thereof.

The interlayer insulating layer 19 is formed on the source metal layer 18. The interlayer insulating layer 19 is formed to cover the TFT 10. The interlayer insulating layer 19 has an opening 19h1 reaching the drain extension section 18a in each pixel P. For example, the interlayer insulating layer 19 includes an inorganic insulating layer which is formed of the inorganic insulation material, and which is formed to cover the TFT 10, and an organic insulating layer (a planarization layer) which is formed on the inorganic insulating layer, and which is formed of an organic insulation material. Further, the interlayer insulating layer 19 is not limited to the above configuration, may have a configuration that the organic insulating layer is not included, and may have a configuration that two or more inorganic insulating layers are stacked.

The first transparent conductive layer 20 is formed on the interlayer insulating layer 19. The first transparent conductive layer 20 is formed of a transparent conductive material. The first transparent conductive layer 20 includes a first transparent electrode 20a. The first transparent electrode 20a is formed not to overlap the entire opening 19h1 of the interlayer insulating layer 19 when viewed in a normal direction of the substrate 11. In FIG. 1, the illustration of the first transparent electrode 20a is omitted. As illustrated in FIG. 4(d), the first transparent conductive layer 20 is formed on an entire surface of the substrate 11, and in each pixel P, the first transparent conductive layer 20 has an opening 20h overlapping the opening 19h1 of the interlayer insulating layer 19 when viewed in the normal direction of the substrate 11. That is, the first transparent electrode 20a is formed in a region other than the opening 20h.

The inorganic insulating layer 21 is formed on the first transparent conductive layer 20. The inorganic insulating layer 21 is formed of the inorganic insulation material. The inorganic insulating layer 21 has an opening 21h1 overlapping the opening 19h1 formed in the interlayer insulating layer 19 when viewed in the normal direction of the substrate 11. The opening 19h1 formed in the interlayer insulating layer 19 and the opening 21h1 formed in the inorganic insulating layer 21 constitute a contact hole CH1. In other words, in the interlayer insulating layer 19 and the inorganic insulating layer 21, the contact hole CH1 reaching the drain extension section 18a is formed.

The second transparent conductive layer 22 is formed on the inorganic insulating layer 21. The second transparent conductive layer 22 is formed of the transparent conductive material. The second transparent conductive layer 22 includes a second transparent electrode 22a. The second transparent electrode 22a is provided for every pixel P (that is, each pixel P includes the second transparent electrode 22a) and is electrically connected to the drain extension section 18a. The second transparent electrode 22a functions as the pixel electrode. In the illustrated example, the pixel electrode 22a is formed on the inorganic insulating layer 21 and in the contact hole CH1, and is in contact with the drain extension section 18a in the contact hole CH1.

The pixel electrode 22a is opposite the first transparent electrode 20a with the inorganic insulating layer 21 interposed therebetween, and the pixel electrode 22a and the first transparent electrode 20a, and the inorganic insulating layer 21 positioned in between the pixel electrode 22a and the first transparent electrode 20a constitute a first auxiliary capacitor CS1. Further, the first auxiliary capacitor CS1 may be formed even when the pixel electrode 22a and the first transparent electrode 20a do not overlap when viewed in the normal direction of the substrate 11.

The lower metal layer 12 is formed below the gate metal layer 14. The lower metal layer 12 may have the single-layer structure or the stacked structure in which the plurality of layers are stacked. The lower metal layer 12 includes at least a layer formed of the metal material. In a case where the lower metal layer 12 has the stacked structure, some layers may be formed of the metal nitride or the metal oxide. The lower metal layer 12 is formed of, for example, any of the metal such as aluminum (Al), tungsten (W), molybdenum (Mo), tantalum (Ta), chromium (Cr), titanium (Ti), and copper (Cu), the alloy containing the above described metal, and the nitride thereof.

The lower insulating layer 13 is formed between the lower metal layer 12 and the gate metal layer 14. The lower insulating layer 13 is formed of an inorganic insulation material. The lower insulating layer 13 is, for example, a silicon oxide (SiOx) film, a silicon nitride (SixNy) film, a silicon oxide nitride (SiOxNy; x>y) film, a silicon nitride oxide (SiNxOy; x>y) film, or the stacked film thereof.

The lower metal layer 12 has a plurality of CS bus lines (auxiliary capacitor wiring) 121 each extending in the column direction, and an auxiliary capacitor electrode 12a provided in each pixel P.

The plurality of CS bus lines 121 extend in parallel with the plurality of source bus lines S. The plurality of CS bus lines 121 are formed not to overlap the plurality of source bus lines S when viewed in the normal direction of the substrate 11. In the illustrated example, the plurality of CS bus lines 121 are disposed between the pixel electrodes 22a of the pixels P adjacent to each other in the row direction. The plurality of CS bus lines 121 are formed not to overlap the pixel electrode 22a when viewed in the normal direction of the substrate 11. When CS bus line 121 is formed not to overlap the pixel electrode 22a, it is possible to suppress a variation of a capacitance value of the parasitic capacitance formed between the CS bus line 121 and the pixel electrode 22a, even in a case where a misalignment occurs between the CS bus line 121 and the pixel electrode 22a in the manufacturing process of the active matrix substrate.

Figure 7:
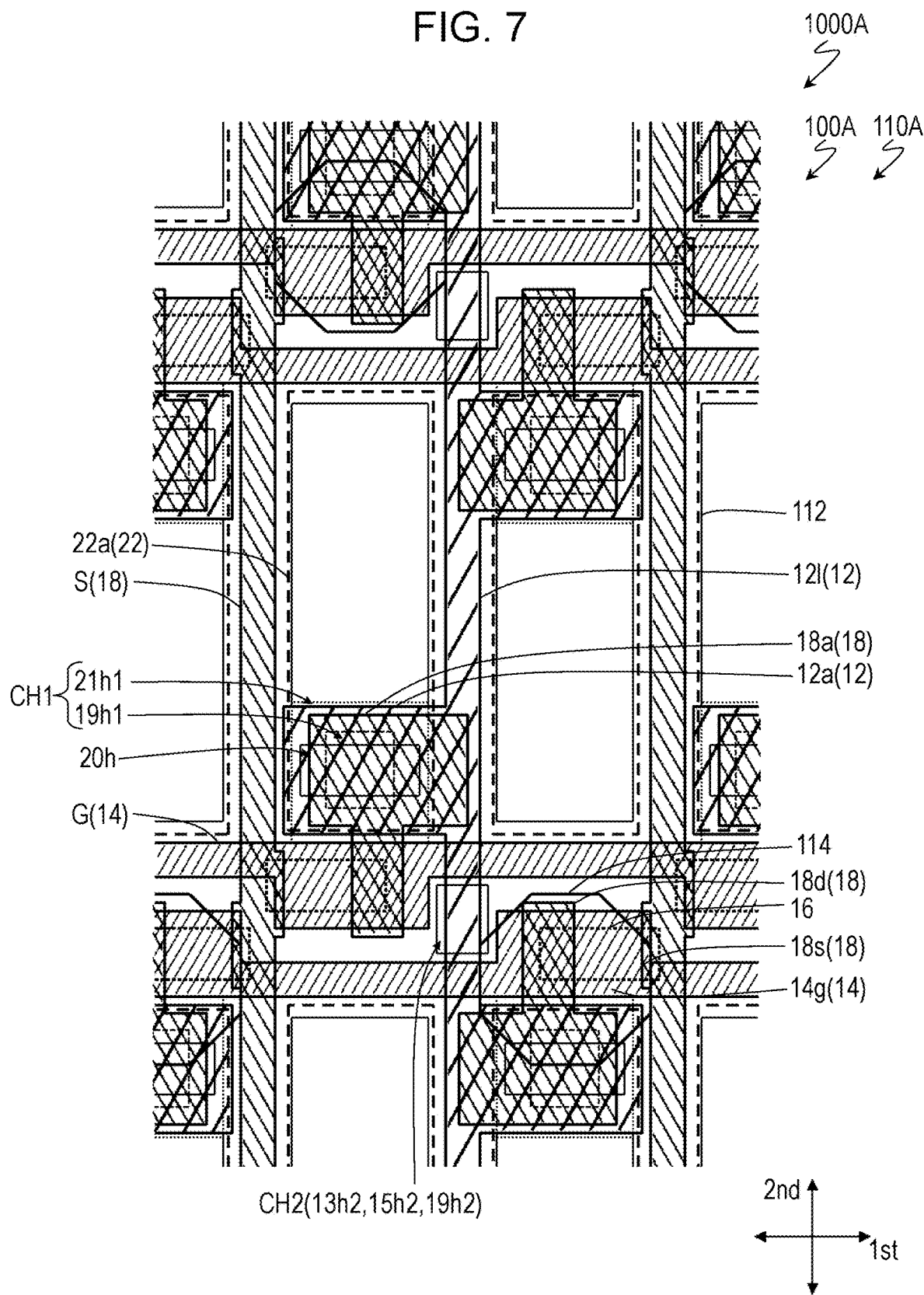
FIG. 7 is a plan view schematically illustrating the liquid crystal display apparatus 1000A.

Further, the CS bus line 121 is formed to overlap the pixel electrode 22a when viewed in the normal direction of the substrate 11. This is a configuration suitably used for, for example, the liquid crystal display apparatus in a normally white TN mode. In the liquid crystal display apparatus in the normally white TN mode, in order to improve a display quality, for example, as illustrated in FIG. 7, an end of the pixel electrode 22a is often covered with a black matrix. When the CS bus line 121 is formed to overlap the end of the pixel electrode 22a, the CS bus line 121 can cover the end of the pixel electrode 22a even in a case where the misalignment occurs between the pixel electrode 22a formed on the active matrix substrate and the black matrix (a light shielding layer) formed on a counter substrate, and thus it is possible to suppress a light leakage. Since the CS bus line 121 is included in the lower metal layer 12, the parasitic capacitance formed between the CS bus line 121 and the pixel electrode 22a is small, and the influence on the display is small.

The auxiliary capacitor electrode 12a is electrically connected to at least one of the plurality of CS bus lines 121. In this example, the auxiliary capacitor electrode 12a extends from the CS bus line 121. The auxiliary capacitor electrode 12a overlaps the drain extension section 18a when viewed in the normal direction of the substrate 11. The auxiliary capacitor electrode 12a is opposite the drain extension section 18a with the lower insulating layer 13 and the gate insulating layer 15 interposed therebetween, and the auxiliary capacitor electrode 12a and the drain extension section 18a, and the lower insulating layer 13 and the gate insulating layer 15 positioned therebetween constitute a second auxiliary capacitor CS2. The second auxiliary capacitor CS2 can be formed even when the auxiliary capacitor electrode 12a and the drain extension section 18a do not overlap when viewed in the normal direction of the substrate 11.

The active matrix substrate 100A has the first auxiliary capacitor CS1 and the second auxiliary capacitor CS2 formed to be electrically connected (for example, connected in parallel) to a liquid crystal capacitor of each pixel P, and thus the display quality of the liquid crystal display apparatus including the active matrix substrate 100A can be improved.

The plurality of CS bus lines 121 are formed between the pixel electrodes 22a of the pixels P adjacent to each other in the row direction, and the auxiliary capacitor electrode 12a is formed to overlap the drain extension section 18a. The plurality of CS bus lines 121 and the auxiliary capacitor electrode 12a are mainly provided in a region not contributing to the display (here, a region not overlapping the pixel electrode 22a or a region overlapping the drain extension section 18a). Therefore, the decrease in aperture ratio due to the provision of the plurality of CS bus lines 121 and the auxiliary capacitor electrode 12a is suppressed. The active matrix substrate 100A can improve the display quality of the liquid crystal display apparatus while suppressing the decrease in the aperture ratio of the liquid crystal display apparatus.

In addition, as described above, since the first transparent electrode 20a and the second transparent electrode 22a constituting the first auxiliary capacitor CS1 are each formed of the transparent conductive material, the active matrix substrate 100A can secure an auxiliary capacitance value while suppressing the decrease in the aperture ratio of the liquid crystal display apparatus.

The structure of the active matrix substrate 100A may be referred to as a "two-layer electrode structure". The two-layer electrode structure denotes a structure in which a lower layer transparent electrode, a dielectric layer covering the lower layer transparent electrode, and an upper layer transparent electrode overlapping the lower layer transparent electrode with the dielectric layer interposed therebetween are provided on the interlayer insulating layer covering the TFT. The active matrix substrate 100A has the two-layer electrode structure, thereby having the first auxiliary capacitor CS1.

The active matrix substrate 100A has the two-layer electrode structure, thereby having the following advantage. Since the pixel electrode 22a can be electrically shielded from the gate bus line G and the source bus line S by the first transparent electrode 20a, it is possible to suppress a formation of an electrostatic capacitance (the parasitic capacitance) between the pixel electrode 22a and the gate bus line G or the source bus line S. Therefore, a flicker or a shadowing can be suppressed. In particular, in a case where the interlayer insulating layer 19 has a thickness of approximately 1 μm to 4 μm and includes the organic insulating layer having a low relative dielectric constant (for example, approximately 2 to 4), it is possible to decrease a load of the gate bus line G or the source bus line S, which enables a reduction of power consumption.

Figure 8:
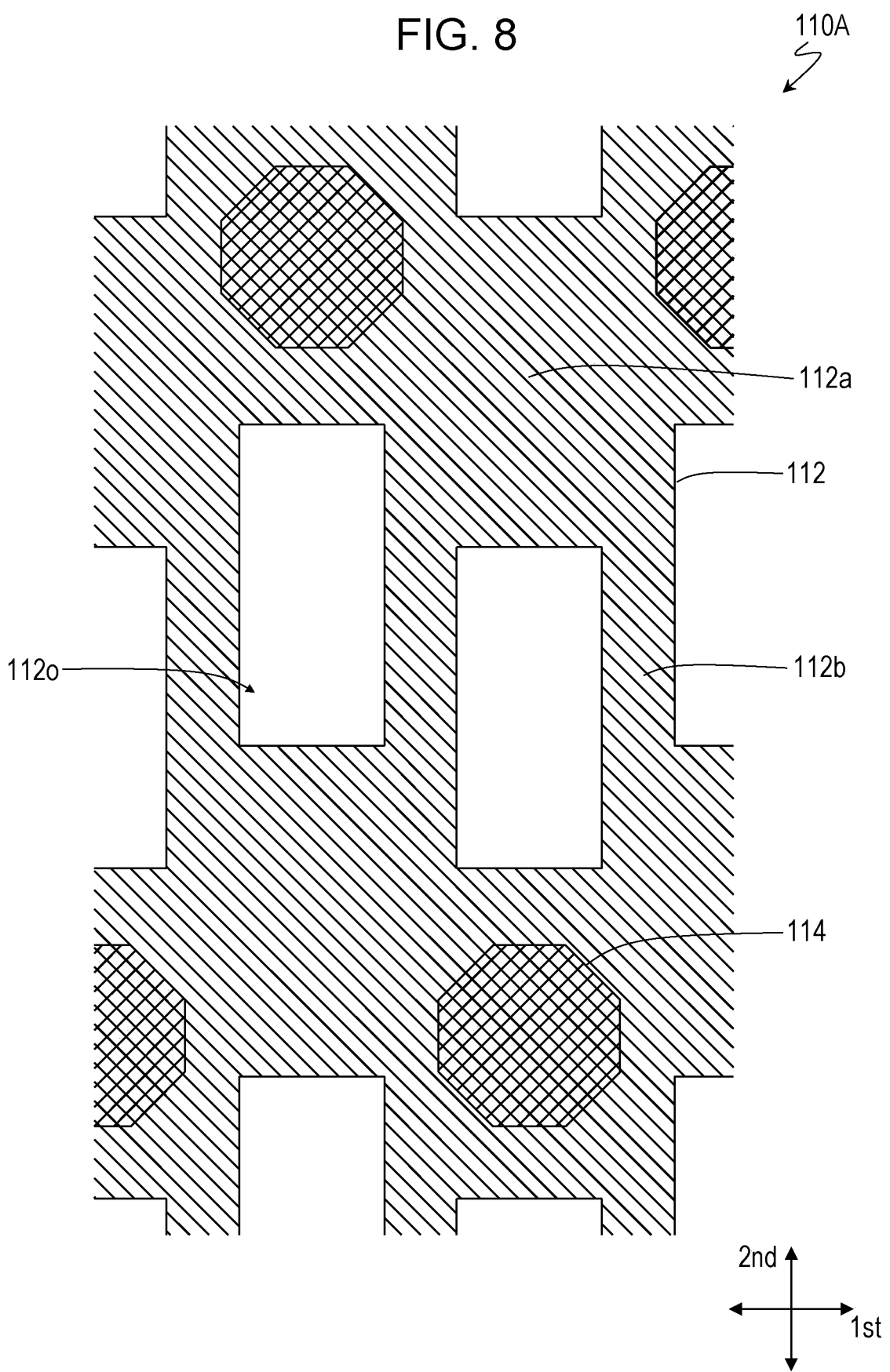
FIG. 8 is a plan view schematically illustrating a counter substrate 110A included in the liquid crystal display apparatus 1000A.

The liquid crystal display apparatus including the active matrix substrate 100A will be described with reference to FIGS. 6, 7, and 8. A liquid crystal display apparatus 1000A of the present embodiment is, for example, a liquid crystal display apparatus in a TN mode or a VA mode. FIGS. 6(a) and 6(b) are views schematically illustrating the liquid crystal display apparatus 1000A, FIG. 7 is a plan view schematically illustrating the liquid crystal display apparatus 1000A, and FIG. 8 is a plan view schematically illustrating a counter substrate 110A included in the liquid crystal display apparatus 1000A.

As illustrated in FIG. 6(a), the liquid crystal display apparatus 1000A includes the active matrix substrate 100A, the counter substrate 110A, and a liquid crystal layer 120 provided between the active matrix substrate 100A and the counter substrate 110A.

The counter substrate 110A is disposed to opposite the active matrix substrate 100A. The counter substrate 110A typically has a color filter (not shown) and a black matrix (a light shielding layer) 112. The black matrix 112 includes a plurality of first light shielding sections 112a each extending in the row direction, a plurality of second light shielding sections 112b each extending in the column direction, and a plurality of openings 112o. In addition, the counter substrate 110A has a plurality of columnar spacers 114 for holding a gap between the active matrix substrate 100A and the counter substrate 110A. The plurality of columnar spacers 114 may include, for example, a first spacer (also referred to as a "main spacer") regulating a distance between the active matrix substrate 100A and the counter substrate 110A, and a second spacer lower than the first spacer (also referred to as a "sub-spacer"). The second spacer is, for example, approximately 0.3 μm lower than the first spacer. Further, the plurality of columnar spacers 114 may be provided on the active matrix substrate 100A.

In a display mode (TN mode or VA mode) in which a longitudinal electric field is applied to the liquid crystal layer 120, the counter electrode (not shown) facing the pixel electrode 22a is provided on the counter substrate 110A. The liquid crystal capacitor of each pixel P of the liquid crystal display apparatus 1000A is constituted by the pixel electrode 22a, the counter electrode formed on the counter substrate 110A, and the liquid crystal layer 120. The counter electrode is formed of the transparent conductive material (for example, ITO).

As described below, in a display mode (for example, a fringe field switching (FFS) mode) in which a lateral electric field is applied to the liquid crystal layer 120, the first transparent electrode 20a functions as a common electrode (also referred to as a "counter electrode"), and the liquid crystal capacitor is constituted by the pixel electrode 22a, a common electrode 20a, and the liquid crystal layer 120. In a liquid crystal display apparatus in the lateral electric field mode, the counter electrode is not provided on the counter substrate typically, but may be provided to be caused to function as a shield electrode for preventing the occurrence of an alignment disorder of the liquid crystal due to an electric field from outside the counter substrate side.

The liquid crystal layer 120 is provided between the active matrix substrate 100A and the counter substrate 110A. As the liquid crystal layer 120, typically, a liquid crystal with positive anisotropy of dielectric constant is used in the TN mode, and a liquid crystal with negative anisotropy of dielectric constant is used in the VA mode. In the FFS mode, the liquid crystal with the positive anisotropy of dielectric constant may be used, or the liquid crystal with the negative anisotropy of dielectric constant may be used.

Alignment films 130a and 130b are provided on a surface of the liquid crystal layer 120 side of each of the active matrix substrate 100A and the counter substrate 110A. For example, in the active matrix substrate 100A, the alignment film 130a is provided on the second transparent conductive layer 22. As the alignment films 130a and 130b, typically, a horizontal alignment film is used in the TN mode or the FFS mode, and a vertical alignment film is used in the VA mode. As the alignment film, an organic alignment film or an inorganic alignment film can be used, for example. The organic alignment film is formed of an organic material such as polyimide, and controls an alignment direction of liquid crystal molecules by a rubbing treatment or the like. The inorganic alignment film controls the alignment direction of liquid crystal molecules by forming a large number of the columnar structures of silicon oxide at a predetermined density.

Typically, a pair of polarizers opposite to each other with the liquid crystal layer 120 interposed therebetween is provided. Furthermore, a retarder is provided on a back surface side of the liquid crystal layer 120 and/or on a viewer side as necessary.

As illustrated in FIG. 6(b), the liquid crystal display apparatus 1000A including the active matrix substrate 100A has a display region defined by the plurality of pixels and a non-display region (also referred to as a "picture-frame region") around the display region. A region R1 of the active matrix substrate 100A corresponding to the display region of the liquid crystal display apparatus 1000A is also referred to as a "display region", and a region R2 of the active matrix substrate 100A other than the display region R1 is referred to as a "non-display region".

The active matrix substrate 100A has a gate driver circuit (also referred to as a "gate driver") 140 and a source driver circuit (also referred to as a "source driver") 150 in the non-display region R2. For example, as illustrated in FIG. 6(b), the gate driver circuit 140 is formed on the substrate 11, and the source driver circuit 150 is mounted on the active matrix substrate 100A using, for example, a chip on glass (COG). Each of the plurality of gate bus lines G is connected to each terminal of the gate driver circuit 140. Each of the plurality of source bus lines S is connected to each terminal of the source driver circuit 150. Without being limited to the above description, the gate driver circuit 140 may be mounted on the active matrix substrate 100A using the chip on glass (COG). The gate driver 140 circuit and/or the source driver circuit 150 may be mounted on the active matrix substrate 100A using a chip on film (COF).

As illustrated in FIG. 6(b), assuming that the row direction is a right and left direction, the gate driver circuit 140 may include a first gate driver 140A disposed on the left side of the display region R1 and a second gate driver 140B disposed on the right side of the display region R1. In the illustrated example, the first gate bus line $G_1$ is supplied with the scan signal voltage from the first gate driver 140A, and the second gate bus line $G_2$ is supplied with the scan signal voltage from the second gate driver 140B. Note that, the disposition of the gate driver circuit 140 and the source driver circuit 150 is not limited to the illustrated example.

Here, the effects of the active matrix substrate 100A of the present embodiment will be more specifically described in comparison with the active matrix substrates of PTL 1 and PTL 2. First, a method of driving the liquid crystal display apparatus having the dual gate drive structure will be described, and a mechanism of causing the flicker or the shadowing will also be described. Then, a description will be made that the active matrix substrate 100A can prevent the occurrence of the flicker or the shadowing by securing the sufficient auxiliary capacitance value.

Figure 9:
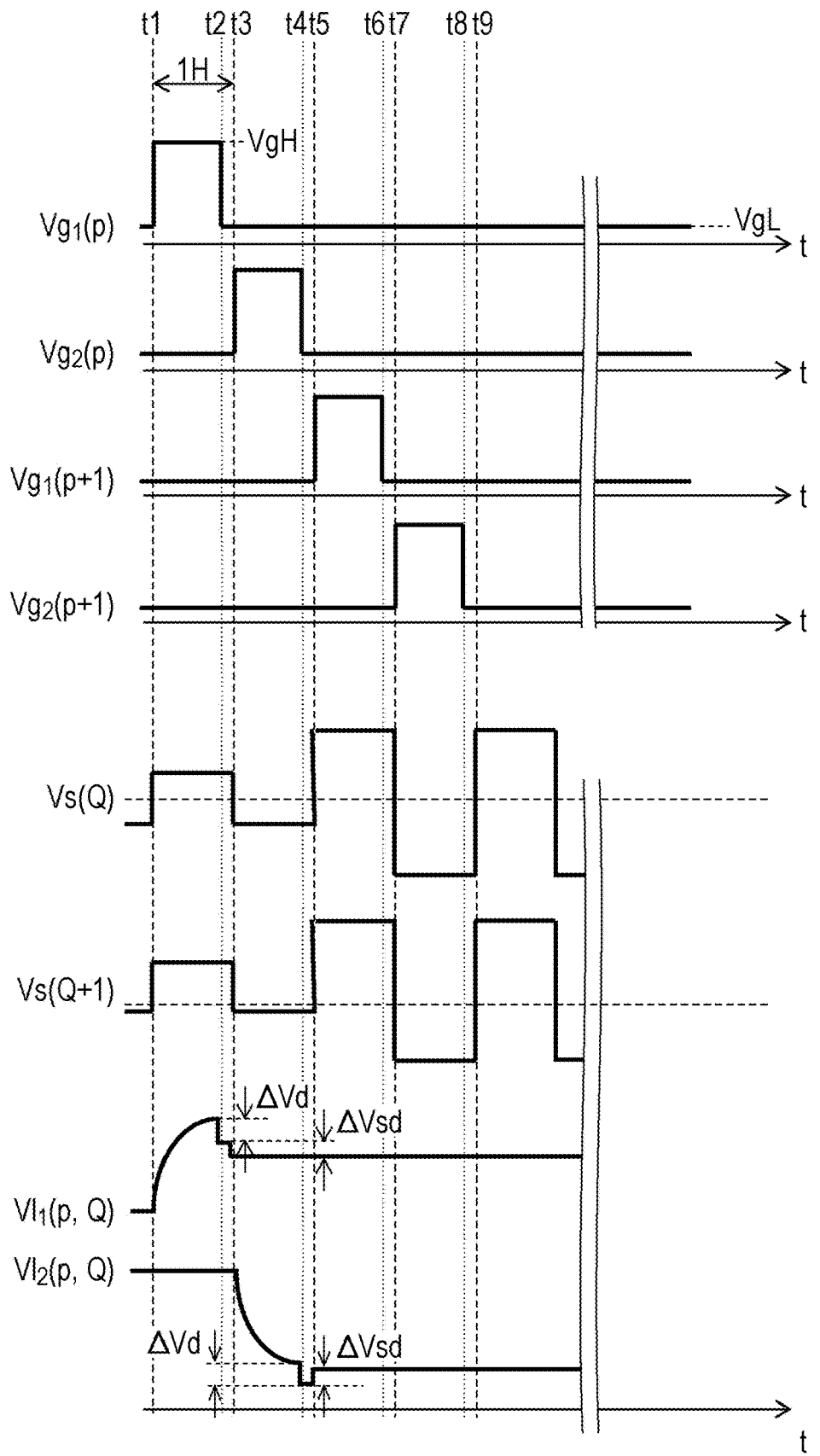
FIG. 9 is a diagram illustrating an example of waveforms of a scan signal voltage Vg and a display signal voltage Vs used for a drive of the liquid crystal display apparatus including the active matrix substrate 100A.

The method of driving the liquid crystal display apparatus including the active matrix substrate 100A will be described with reference to FIG. 9. FIG. 9 is a diagram illustrating an example of waveforms of a scan signal voltage Vg and a display signal voltage Vs used for driving the liquid crystal display apparatus including the active matrix substrate 100A.

Since the liquid crystal display apparatus having the active matrix substrate 100A of the present embodiment has the dual gate drive structure in common with the liquid crystal display apparatus of PTL 1 and PTL 2, the description regarding the method of driving the liquid crystal display apparatus of the present embodiment can be one regarding the method of driving the liquid crystal display apparatus of PTL 1 and PTL 2.

Note the p-th pixel row. The first gate bus line $G_1(p)$ and the second gate bus line $G_2(p)$ are associated with the p-th pixel row. The TFT 10 of the first pixel $P_1$ which is included in the p-th pixel row is supplied with the scan signal voltage $Vg_1(p)$ from the first gate bus line $G_1(p)$, and the TFT 10 of the second pixel $P_2$ which is included in the p-th pixel row is supplied with the scan signal voltage $Vg_2(p)$ from the second gate bus line $G_2(p)$.

At time t1, the scan signal voltage $Vg_1(p)$ changes from VgL (low) to VgH (high), and thus the TFT 10 of the first pixel $P_1$ included in the p-th pixel row is in a conductive state (on state), the pixel electrode 22a is supplied with the display signal voltage from the source bus line S, and the pixel capacitor is charged. The pixel capacitor includes the liquid crystal capacitor and the auxiliary capacitor. The auxiliary capacitor of each pixel of the active matrix substrate 100A includes the first auxiliary capacitor CS1 and the second auxiliary capacitor CS2.

At time t2, the scan signal voltage $Vg_1(p)$ changes from VgH (high) to VgL (low), and thus the TFT 10 of the first pixel $P_1$ included in the p-th pixel row is in a non-conductive state (off state), and the pixel capacitor is electrically insulated from the source bus line S. A capacitance value C-Cpix of the pixel capacitor is represented as follows.

$$C\text{-}Cpix = C\text{-}Clc(V) + C\text{-}Ccs$$

Here, C-Clc(V) indicates the capacitance value of the liquid crystal capacitor, and depends on an effective voltage (V) applied to the liquid crystal layer of each pixel. C-Ccs indicates the capacitance value of the auxiliary capacitor.

Immediately after time t2, the voltage of the pixel electrode 22a decreases by the amount of a pull-in voltage (also referred to as a field-through voltage) due to the pull-in phenomenon from the influence of the parasitic capacitance between the gate and the drain. The pull-in voltage ΔVd due to the influence of the capacitance between the gate and the drain is as the following expression.

$$\Delta Vd = C\text{-}Cgd/(C\text{-}Cpix + C\text{-}Cgd + C\text{-}Csd) \times (VgH\text{-}VgL)$$

Here, C-Cgd indicates the capacitance value of the parasitic capacitance between the gate and the drain, and C-Csd indicates the capacitance value of the parasitic capacitance between the source and the drain. The "parasitic capacitance between the gate and the drain" also includes the parasitic capacitance formed between the gate electrode and the pixel electrode electrically connected to the drain electrode, and the "parasitic capacitance between the source and the drain" includes the parasitic capacitance formed between the source electrode and the pixel electrode electrically connected to the drain electrode. VgH and VgL indicate the values of the scan signal voltage when the gate of the TFT is on and off, respectively. Further, in the present specification, "×" represents multiplication.

Further, a drain potential Vd changes by ΔVsd under the influence of the parasitic capacitance between the source and the drain. ΔVsd is represented by the following expression using a change amount ΔVs of the display signal voltage.

$$\Delta Vsd = C\text{-}Csd/(C\text{-}Cpix + C\text{-}Cgd + C\text{-}Csd) \times \Delta Vs$$

Therefore, assuming that the display signal voltage supplied from the source bus line S is set as the display signal voltage Vs, the voltage $Vl_1(p, Q)$ of the pixel electrode 22a of the first pixel $P_1$ connected to the first gate bus line $G_1(p)$ and the source bus line S(Q) is as the following expression.

$$Vl_1(p,Q) = Vs - \Delta Vd - \Delta Vsd$$

Thereafter, at time t3, the scan signal voltage $Vg_2(p)$ changes from VgL (low) to VgH (high), and thus the TFT 10 of the second pixel $P_2$ included in the p-th pixel row is in the conductive state (on state), and the pixel electrode 22a is supplied with the display signal voltage from the source bus line S, and the pixel capacitor is charged. In the example illustrated in FIG. 9, the polarity of the display signal voltage is inverted every 1H (one horizontal scanning period). At this time, in the second pixel $P_2$, the direction of change of the display signal voltage (that is, the change amount ΔVs of the display signal voltage is positive or negative) is opposite to that of the first pixel $P_1$. Therefore, the voltage $Vl_2(p, Q)$ of the pixel electrode 22a of the second pixel $P_2$ connected to the second gate bus line $G_2(p)$ and the source bus line S(Q) is as the following expression.

$$Vl_2(p,Q) = Vs - \Delta Vd + \Delta Vsd$$

Similarly, all gate bus lines G are sequentially selected in each vertical scanning period (also referred to as a frame period).

Further, the "vertical scanning period (frame period)" means a period from a certain gate bus line is selected and until the gate bus line is selected. A difference (period) between the time of selecting a certain gate bus line and the time of selecting the next gate bus line in each vertical scanning period (frame period) is referred to as "one horizontal scanning period (1H)". One horizontal scanning period of the liquid crystal display apparatus having the dual gate drive structure is approximately half the single gate drive structure.

ΔVd generated under the influence of the parasitic capacitance may cause the flicker as described below. In addition, depending on a pattern to be displayed, as described below, a phenomenon called shadowing may occur due to ΔVsd. When ΔVd or C-Cgd/(C-Cpix+C-Cgd+C-Csd) is small, the influence on the flicker is small (since ΔVd is proportional to C-Cgd/(C-Cpix+C-Cgd+C-Csd)). In addition, when ΔVsd or C-Csd/(C-Cpix+C-Cgd+C-Csd) is small, (since ΔVsd is proportional to C-Csd/(C-Cpix+C-Cgd+C-Csd), even in a case of the shadowing occurring, the influence on the display quality is small. However, when the capacitance value C-Ccs of the auxiliary capacitor is smaller than the capacitance values C-Csd and C-Cgd of the parasitic capacitance, ΔVd and ΔVsd become large, and the influence on the display quality becomes large.

In the active matrix substrate 100A of the present embodiment, since each pixel has the first auxiliary capacitor CS1 and the second auxiliary capacitor CS2, it is possible to secure the sufficient auxiliary capacitance value while suppressing the decrease in the aperture ratio of the liquid crystal display apparatus. Accordingly, it is possible to suppress the decrease in the display quality due to the flicker and the shadowing.

Here, the mechanism of causing the flicker will be described.

As described above, the voltage of the pixel electrode (a potential of the pixel electrode with respect to a ground level) changes in the specific direction (in the case of the present embodiment, a negative side) by ΔVd regardless of the polarity of the display signal voltage. At this time, in a case where the voltage (potential) of the counter electrode is at the ground level, the voltage applied to the liquid crystal layer (the difference between the potential of the pixel electrode and the potential of the counter electrode) differs depending on the polarity of the display signal voltage. Specifically, the voltage applied to the liquid crystal layer is smaller in a case where the polarity of the display signal voltage is positive than in a case where the polarity of the display signal voltage is negative. Furthermore, since the liquid crystal has the anisotropy of dielectric constant, the liquid crystal capacitor C-Clc (V) varies depending on the display (alignment state of liquid crystal molecules). Therefore, the size of ΔVd also varies in accordance with the display signal voltage.

The flicker, that is, the display flicker caused by as described above, may occur; however, with respect to the flicker, for example, the occurrence of the flicker can be suppressed by correcting the voltage (potential) of the counter electrode or correcting the display signal voltage in advance.

However, even when the correction as described above is performed, the flicker may still occur. This is because, for example, ΔVd varies due to the bluntness of the scan signal voltage, an irregularity of the thickness (cell thickness) of the liquid crystal layer, or the like, which may cause the irregularity of ΔVd.

Next, the mechanism of causing the shadowing occurs will be described.

FIGS. 10(a) and 10(b) are views for describing the shadowing in a normally black mode (for example, the VA mode). FIG. 10(a) illustrates a display screen when the pattern illustrated in FIG. 10(b) is displayed on the liquid crystal display apparatus in the normally black mode. The pattern illustrated in FIG. 10(b) is a display pattern (also referred to as a window pattern) which has a region A with a high luminance at a center portion, and has a region with a low luminance around the region A (regions B and C), and in which white is displayed in the region A, and gray (gray levels) with the lower luminance than region A is displayed in the regions B and C. The region B is a display region in upper and lower sides of the region A (the direction parallel to the column direction is set as the up and down direction), and the region C is a display region in the right and left of the region A (the direction parallel to the row direction is set as the right and left direction). The region B is a region that should be displayed in the same manner as the region C in the first place. However, as described above, under the influence of the parasitic capacitance between the source and the drain based on the display signal voltage in the period for displaying the region A, the effective value of the drain potential Vd of the pixel in the region B becomes large, as a result, the gray scale of the region B increases (becomes gray with luminance higher than that in the region C), and as illustrated in FIG. 10(a), and an image appears, which seems that the shadow of a white square displayed in the region A is reflected in the region B.

Although the liquid crystal display apparatus in the normally black mode is described as an example in FIG. 10, the shadowing similarly also occurs in a case where the normally white mode (the white display when no voltage is applied; for example, the TN mode) is adopted. For example, shadowing occurs because the gray scale of the upper and lower portions of the black display portion reduces (becomes gray with low luminance).

FIG. 5 illustrates the polarity of the display signal voltage applied to each pixel in a certain vertical scanning period in a case where the liquid crystal display apparatus including the active matrix substrate 100A is driven using various signal voltages illustrated in FIG. 9. In the example illustrated in FIG. 9, the display signal voltage Vs supplied to each source bus line S is inverted in polarity every horizontal scanning period (1H). In addition, the polarities of the display signal voltages Vs supplied to the source bus lines S adjacent to each other are equal to each other in respective horizontal scanning periods. When the active matrix substrate 100A is driven using such a display signal voltage, as illustrated in FIG. 5, in each vertical scanning period, the polarity is inverted every pixel column in the row direction, and the polarity of the pixel in each pixel row is in the equal state. That is, the polarities of the signal voltages supplied to the pixels adjacent to each other in the row direction are opposite to each other.

The present embodiment is not limited to the illustrated example, and the connection relationship between the TFT 10, and the gate bus line G and source bus line S, and the polarity of the display signal voltage supplied to the source bus line S may be appropriately adjusted. For example, when the polarity of the display signal voltage Vs supplied to each source bus line S is inverted every two horizontal scanning periods (2H), the polarity of the signal voltages supplied to adjacent pixels in each vertical scanning period can be opposite to each other (such a state is the same as the arrangement of drive scheme referred to as a "dot inversion" in a case of focusing on the polarity of each pixel).

The active matrix substrate included in the liquid crystal display apparatus of PTLs 1 and 2 has the dual gate drive structure as in the active matrix substrate of the present embodiment, but differs from the active matrix substrate of the present embodiment in the configuration of the auxiliary capacitor.

The active matrix substrates of PTLs 1 and 2 do not have the two-layer electrode structure. Furthermore, the active matrix substrates of PTLs 1 and 2 do not have the conductive layer formed below the gate metal layer. The auxiliary capacitor included in each pixel of the active matrix substrate in FIG. 1 of PTL 1 and PTL 2 is constituted by the auxiliary capacitor electrode formed in a gate metal layer, the pixel electrode, and the insulating layer positioned therebetween. In the active matrix substrates of PTLs 1 and 2, since the auxiliary capacitor electrode is formed to overlap the pixel electrode, it is possible to decrease the aperture ratio of the liquid crystal display apparatus by forming the auxiliary capacitor electrode to be large. In addition, since the active matrix substrates of PTLs 1 and 2 do not have the two-layer electrode structure, the auxiliary capacitance value may not be sufficient from the viewpoint of suppressing the occurrence of the flicker or the shadowing.

The effects of the active matrix substrate 100A of the present embodiment will be described in comparison with active matrix substrates of Reference Examples 1 and 2.

Figure 11:
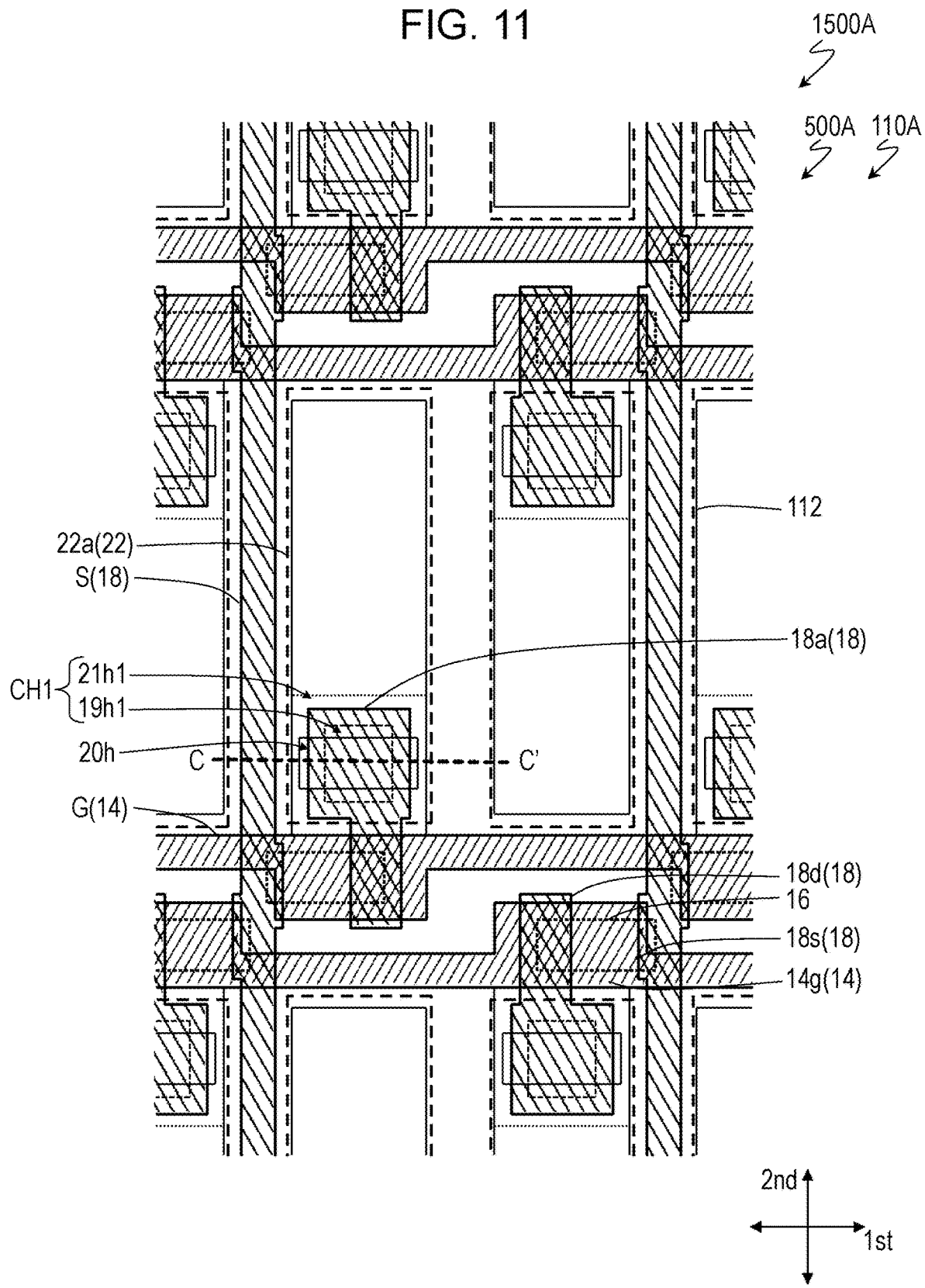
FIG. 11 is a plan view schematically illustrating a liquid crystal display apparatus 1500A including an active matrix substrate 500A of Reference Example 1.
Figure 12:
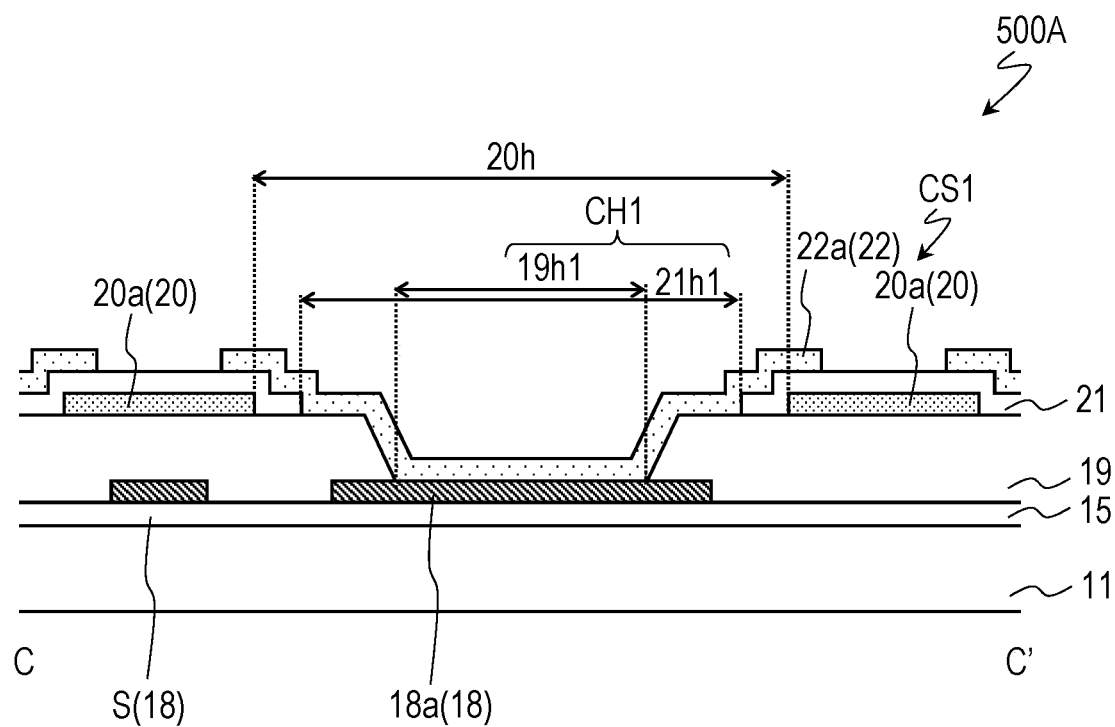
FIG. 12 is a sectional view schematically illustrating the active matrix substrate 500A, and illustrates a sectional structure of the active matrix substrate 500A taken along the line C-C' in FIG. 11.

FIG. 11 is a plan view schematically illustrating a liquid crystal display apparatus 1500A including an active matrix substrate 500A of Reference Example 1, and FIG. 12 is a sectional view schematically illustrating the active matrix substrate 500A. FIG. 12 illustrates a sectional structure of the active matrix substrate 500A taken along the line C-C' in FIG. 11. The liquid crystal display apparatus 1500A includes the active matrix substrate 500A, the counter substrate 110A, and the liquid crystal layer (not shown). In FIG. 11, the columnar spacer of the counter substrate 110A is omitted from illustration.

As illustrated in FIGS. 11 and 12, the active matrix substrate 500A of Reference Example 1 does not have the lower metal layer 12 and the lower insulating layer 13, which differs from the active matrix substrate 100A of the present embodiment. Therefore, the active matrix substrate 500A of Reference Example 1 does not have the second auxiliary capacitor CS2, which differs from the active matrix substrate 100A of the present embodiment.

The active matrix substrate 500A of Reference Example 1 has the first auxiliary capacitor CS1 formed by the two-layer electrode structure. Therefore, the active matrix substrate 500A of Reference Example 1 has the advantage of being able to secure the auxiliary capacitance value while suppressing the decrease in the aperture ratio, in comparison with the active matrix substrates of PTLs 1 and 2.

Note that, in the active matrix substrate 500A of Reference Example 1, the auxiliary capacitance value of each pixel may not be sufficient. For example, when the pixel pitch of the active matrix substrate becomes small, the ratio of an area of the opening 20h of the first transparent conductive layer 20 to an area of the pixel P increases, and the capacitance value of the first auxiliary capacitor CS1 becomes small with respect to the capacitance value of the pixel capacitor. In this case, it may not be possible to secure the sufficient auxiliary capacitance value with the first auxiliary capacitor CS1 alone. Such a problem tends to occur particularly in the active matrix substrate used for the high resolution liquid crystal display apparatus. For example, when the liquid crystal display apparatus having the active matrix substrate of the present embodiment is set as a 3.1 type (3.1 inch) full high definition (FHD) panel, the number of pixels is 1080 rows×(1920×3) column, the pixel pitch in the row direction (Px in FIG. 1) is 12 µm, and the pixel pitch in the column direction (Py in FIG. 1) is 36 µm (approximately 700 ppi). In such a small size type, the high resolution liquid crystal display apparatus is suitably used, for example, in a head mounted display.

Figure 13:
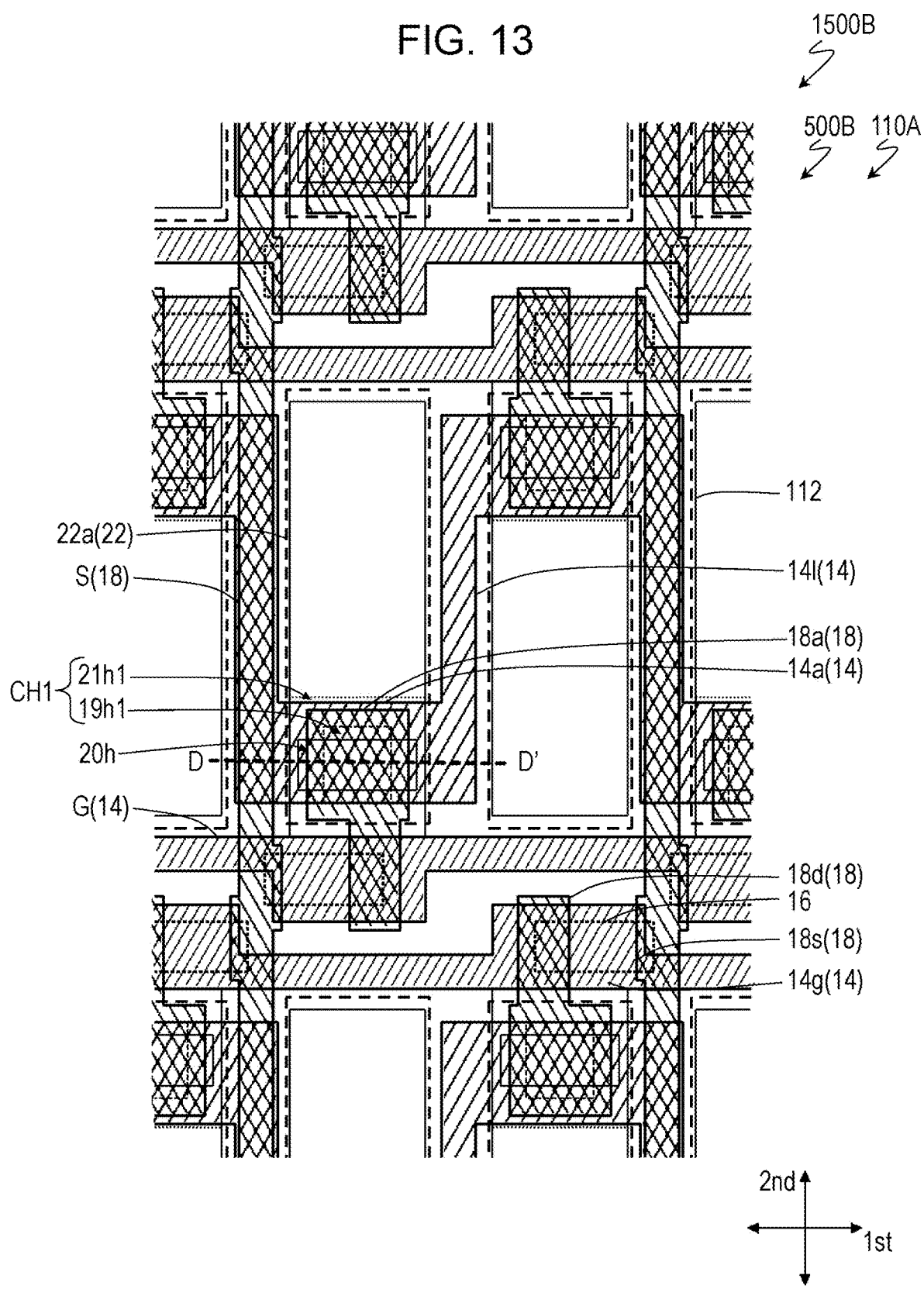
FIG. 13 is a plan view schematically illustrating a liquid crystal display apparatus 1500B including an active matrix substrate 500B of Reference Example 2.
Figure 14A:
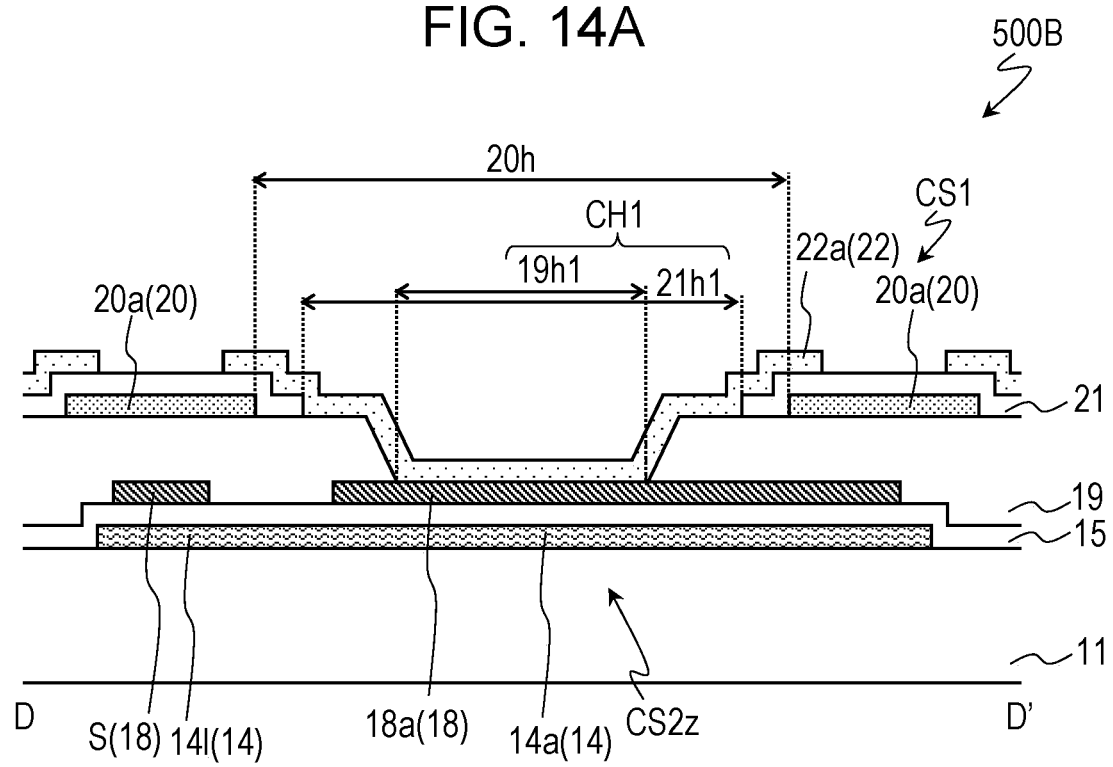
FIG. 14A is a sectional view schematically illustrating the active matrix substrate 500B, and illustrates a sectional structure of the active matrix substrate 500B taken along the line D-D' in FIG. 13.

FIG. 13 is a plan view schematically illustrating a liquid crystal display apparatus 1500B including an active matrix substrate 500B of Reference Example 2, FIG. 14A is a sectional view schematically illustrating the active matrix substrate 500B. FIG. 14A illustrates a sectional structure of the active matrix substrate 500B taken along the line D-D' in FIG. 13. The liquid crystal display apparatus 1500B includes the active matrix substrate 500B, the counter substrate 110A, and the liquid crystal layer (not shown). In FIG. 13, the columnar spacer of the counter substrate 110A is omitted from illustration.

As illustrated in FIGS. 13 and 14A, the active matrix substrate 500B of Reference Example 2 has a CS bus line 141 and an auxiliary capacitor electrode 14a formed by the gate metal layer 14, which differs from the active matrix substrate 500A of Reference Example 1. The CS bus line 141 is electrically separated from the gate bus line G. When viewed in the normal direction of the substrate 11, the auxiliary capacitor electrode 14a overlaps the drain extension section 18a. An auxiliary capacitor CS2z is constituted by the auxiliary capacitor electrode 14a, the drain extension section 18a, and the gate insulating layer 15 positioned therebetween. The active matrix substrate 500B of Reference Example 2 has the auxiliary capacitor CS2z, which differs from the active matrix substrate 500A of Reference Example 1.

The active matrix substrate 500B of Reference Example 2 can increase the auxiliary capacitance value more than the active matrix substrate 500A of Reference Example 1 because the active matrix substrate 500B has the auxiliary capacitor CS2z. The active matrix substrate 500B of Reference Example 2 can improve the display quality of the liquid crystal display apparatus more effectively than the active matrix substrate 500A of Reference Example 1.

However, in the active matrix substrate 500B of Reference Example 2, when viewed in the normal direction of the substrate 11, the source bus line S overlaps the CS bus line 141. Accordingly, the parasitic capacitance is formed between the source bus line S and the CS bus line 141, and the problem may occur that a source bus line load (a product of the capacitance and the resistance (also referred to as a "CR product") increases. When the source bus line load increases, the display signal may become blunt, which may cause a case where the appropriate gray-scale display is not possible. Furthermore, the shadowing is likely to occur, as described below. When the source bus line S and the CS bus line 141 are formed not to overlap for reducing the source bus line load, the aperture ratio of the liquid crystal display apparatus may decrease.

Figure 14B:
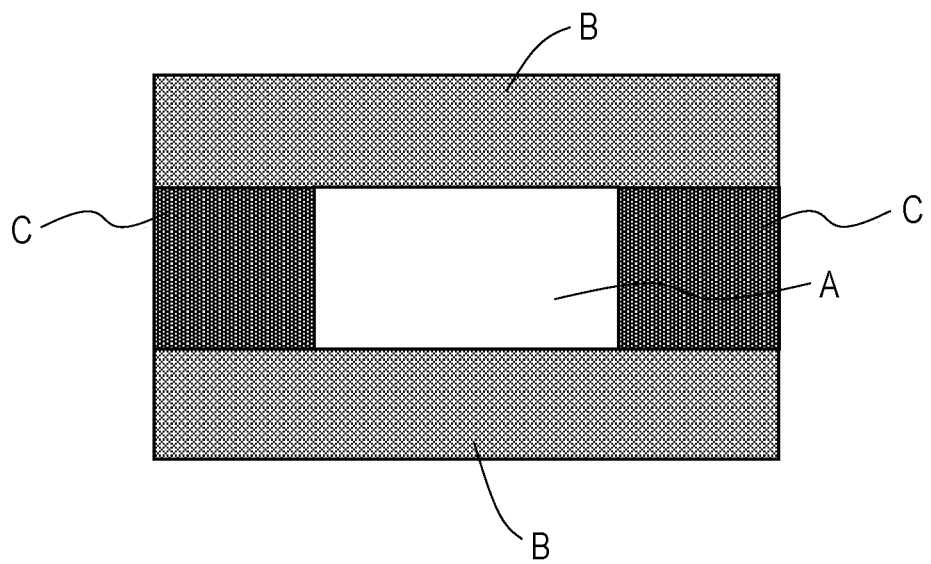
FIG. 14B is a view for describing the shadowing in the normally black mode.

The mechanism of causing the shadowing due to the parasitic capacitance between the source bus line and the CS bus line will be described with reference to FIG. 14B. FIG. 14B is a view for describing shadowing in the normally black mode (for example, the VA mode). FIG. 14B illustrates the display screen when the pattern illustrated in FIG. 10(b) is displayed on the liquid crystal display apparatus in the normally black mode.

The CS bus line of the liquid crystal display apparatus may be connected to wiring for supplying the signal to the counter electrode. In such a case, the potential of the CS bus line varies under the influence of the parasitic capacitance between the source bus line and the CS bus line, and the display signal voltage, and furthermore, the potential of the counter electrode connected to the CS bus line also varies. In each pixel, when the potential of the counter electrode varies when the display signal voltage is supplied from the source bus line S, the voltage applied to the liquid crystal varies.

For example, in the normally black mode (for example, VA mode), the example of the case where the display pattern (the pattern illustrated in FIG. 10(b)) is displayed, the display pattern having the region A with the high luminance (white) at the center portion, and having the (gray) region with the low luminance around the region A (the regions B and C), is illustrated. The region B is the display region on the right and left (the direction parallel to the row direction is set as the right and left direction) of the region A, and the region C is the display region on the upper and lower sides (the direction parallel to the column direction is set as the up and down direction) of the region A. The region B is a region that should be displayed in the same manner as the region C in the first place. However, as described above, under the influence of the parasitic capacitance between the source bus line and the CS bus line in the region A, the potential of the counter electrode when the display signal voltage is supplied to the pixels in the region A and the region B changes from the potential of the counter electrode when the display signal voltage is supplied to the pixel in the region C. Specifically, in a case of charging a positive electrode side, the potential of the counter electrode becomes high, and in a case of charging a negative electrode side, the potential of the counter electrode becomes low. Therefore, the voltage applied to the liquid crystal is lower in the pixel in the region B than in the pixel in the region C. That is, the region B becomes gray lower in luminance than the region C, and an image as illustrated in FIG. 14B may appear.

The above description is about a case where the CS bus line is connected to the wiring for supplying a signal to the counter electrode; however, the same phenomenon may occur in a configuration that the CS bus line is not connected to the wiring for supplying the signal to the counter electrode. Due to the influences of the parasitic capacitance between the source bus line and the CS bus line, and the display signal voltage, the potential of the CS bus line varies during a charging period, and thereafter (after the TFT is in the off state), the CS bus line returns to (or approaches) the regulated value, and thus the voltage applied to the liquid crystal varies.

Further, the example based on the configuration described in FIG. 5 or the like is illustrated up to this point; however, the same phenomenon may occur in a case of the other configuration as well, for example, by causing the region A to perform the specific display. In that case, the luminance of the region B is not necessarily the same as above, and the luminance may be high or low.

The active matrix substrate 100A of the present embodiment can secure the auxiliary capacitance value while suppressing the decrease in the aperture ratio of the liquid crystal display apparatus more effectively than the active matrix substrates of Reference Examples 1 and 2. The active matrix substrate 100A of the present embodiment has the two-layer electrode structure. Furthermore, the plurality of CS bus lines 121 and the auxiliary capacitor electrodes 12a are mainly provided in the region not contributing to the display. Accordingly, the active matrix substrate 100A can secure the auxiliary capacitance value while suppressing the decrease in the aperture ratio of the liquid crystal display apparatus. Therefore, it is possible to improve the display quality while suppressing the decrease in the aperture ratio of the liquid crystal display apparatus including the active matrix substrate 100A.

Further, since the plurality of CS bus lines 121 are formed not to overlap the source bus line S, the active matrix substrate 100A has the advantage of being able to secure the auxiliary capacitance value without increasing the source bus line load. Therefore, the active matrix substrate 100A can improve the display quality of the liquid crystal display apparatus while suppressing the increase in the source bus line load.

In the active matrix substrate 100A, for example, as illustrated in FIG. 1, the drain extension section 18a may be formed to overlap any one of the plurality of CS bus lines 121 when viewed in the normal direction of the substrate 11. Accordingly, the capacitance value of the auxiliary capacitor CS2 can be increased.

The semiconductor layer 16 included in the active matrix substrate 100A may be an oxide semiconductor layer. The oxide semiconductor included in the oxide semiconductor layer may be an amorphous oxide semiconductor or a crystalline oxide semiconductor having a crystalline portion. Examples of the crystalline oxide semiconductors include polycrystalline oxide semiconductors, microcrystalline oxide semiconductors, and crystalline oxide semiconductors in which c-axes are substantially aligned vertically to the layer surface.

The oxide semiconductor layer may have a stacked structure of two or more layers. In a case where the oxide semiconductor layer has the stacked structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has the two-layer structure including the upper layer and the lower layer, an energy gap of the oxide semiconductor included in the upper layer is preferably larger than the energy gap of the oxide semiconductor included in the lower layer. Note that, in a case where a difference of the energy gap between the layers is relatively small, the energy gap of the oxide semiconductor of the lower layer may be larger than the energy gap of the oxide semiconductor of the upper layer.

Japanese Unexamined Patent Application Publication No. 2014-007399 discloses, for example, a material, a structure, and a film formation method of the amorphous oxide semiconductor and each crystalline oxide semiconductor, and a configuration of the oxide semiconductor layer having the stacked structure. The entire disclosure of Japanese Unexamined Patent Application Publication No. 2014-007399 is incorporated herein by reference.

The oxide semiconductor layer may include, for example, at least one type of metal element among In, Ga, and Zn. In the present embodiment, the oxide semiconductor layer contains, for example, an In—Ga—Zn—O-based semiconductor (for example, indium gallium zinc oxide). Here, the In—Ga—Zn—O-based semiconductor is a ternary oxide of Indium (In), Gallium (Ga), and Zinc (Zn), the ratio (the composition ratio) of In, Ga, and Zn is not particularly limited, and the examples thereof include In:Ga:Zn=2:2:1, In:Ga:Zn=1:1:1, and In:Ga:Zn=1:1:2. Such an oxide semiconductor layer may be formed of an oxide semiconductor film that contains the In—Ga—Zn—O-based semiconductor.

The In—Ga—Zn—O-based semiconductor may be amorphous and may be crystalline. As the crystalline In—Ga—Zn—O-based semiconductor, the crystalline In—Ga—Zn—O-based semiconductor in which the c-axes substantially align vertically to the layer surface is preferable.

Further, the crystal structure of the crystalline In—Ga—Zn—O-based semiconductor, for example, is disclosed in the above described Japanese Unexamined Patent Application Publication Nos. 2014-007399, 2012-134475, 2014-209727, and the like. The entire disclosure of Japanese Unexamined Patent Application Publication Nos. 2012-134475 and 2014-209727 is incorporated in the present specification by reference. A TFT that has an In—GA—Zn—O-based semiconductor layer has a high mobility (which is more than 20 times that of an a-Si TFT) and a low leak current (which is less than one-hundredth of that of the a-Si TFT), and thus can be suitably used as a drive TFT (for example, a TFT included in a drive circuit which is provided on the same substrate as the display region around the display region including the plurality of pixels) and the pixel TFT (the TFT that is provided in the pixel).

The oxide semiconductor layer may contain the other oxide semiconductor instead of the In—Ga—Zn—O-based semiconductor. For example, an In—Sn—Zn—O-based semiconductor (for example, $In_2O_3$—$SnO_2$—ZnO; InSnZnO) may be included. The In-Sn-Zn-O-based semiconductor is the ternary oxide of Indium (In), Tin (Sn), and Zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O—based semiconductor, a Cd—Pb—O-based semiconductor, a cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O—based semiconductor, or the like.

It is preferable that the potential of the auxiliary capacitor electrode 12a of the active matrix substrate 100A is constant. Note that, without being limited thereto, for example, it is possible to supply the auxiliary capacitor electrode 12a with a voltage having a rectangular wave (oscillation waveform) in which an inversion cycle is same as that of the display signal voltage and the polarity is opposite to that of the display signal voltage. The auxiliary capacitor electrode 12a is supplied with CS voltage from the CS bus line 121. For example, the CS voltage supplied to each of the plurality of CS bus lines 121 is preferably the same as the voltage supplied to the first transparent electrode 20a. That is, the plurality of CS bus lines 121 are preferably electrically connected to the first transparent conductive layer 20. The active matrix substrate 100A has a CS connection section that electrically connects each of the plurality of CS bus lines 121 to the first transparent conductive layer 20. The CS connection section is provided in the display region R1 and/or the non-display region R2 of the active matrix substrate 100A. Each of the plurality of CS bus lines 121 may be electrically connected to the first transparent conductive layer 20 with a conductive connection section interposed therebetween, for example, in the non-display region R2. The conductive connection section is formed of, for example, the gate metal layer 14 or the second transparent conductive layer 22.

For example, as illustrated in FIG. 1, the active matrix substrate 100A has a plurality of contact holes CH2 connecting the CS bus line 121 and the first transparent conductive layer 20 in the display region R1. Each of the contact holes CH2 is constituted by an opening 13h2 formed in the lower insulating layer 13, an opening 15h2 formed in the gate insulating layer 15, and an opening 19h2 formed in the interlayer insulating layer 19. In other words, in the lower insulating layer 13, the gate insulating layer 15, and the interlayer insulating layer 19, the plurality of contact holes CH2 each reaching any one of the plurality of CS bus lines 121 are formed. The first transparent conductive layer 20 is in contact with the CS bus line 121 in the opening 13h2 formed in the lower insulating layer 13. By providing the contact hole CH2, the resistance of the first transparent conductive layer 20 (the first transparent electrode 20a) can be reduced.

As illustrated in FIG. 7, the contact hole CH2 is formed in a region where a black matrix 112 (for example, the first light shielding section 112a extending in the row direction) is formed. Therefore, even when the alignment disorder of the liquid crystal molecules of the liquid crystal layer occurs around the contact hole CH2, the portion where the alignment disorder occurs is covered with the black matrix 112, so that the decrease in the display quality of the liquid crystal display apparatus 1000A is suppressed. More specifically, for example, as illustrated in FIGS. 1 and 7, the contact hole CH2 includes the contact hole CH2 formed between the first gate bus line $G_1$ associated with a certain pixel row and the second gate bus line $G_2$ associated with the pixel row adjacent to the certain pixel row. In the illustrated example, the formation is made between the second gate bus line $G_2(p)$ associated with the p-th row and the first gate bus line $G_1(p+1)$ associated with the (p+1)-th row. In the example illustrated in FIGS. 1 and 7, the contact hole CH2 is provided for every pixel row in the column direction and every two pixel columns in the row direction. That is, the contact hole CH2 is provided at a rate of one in two pixels.

MODIFICATION EXAMPLE

Figure 15:
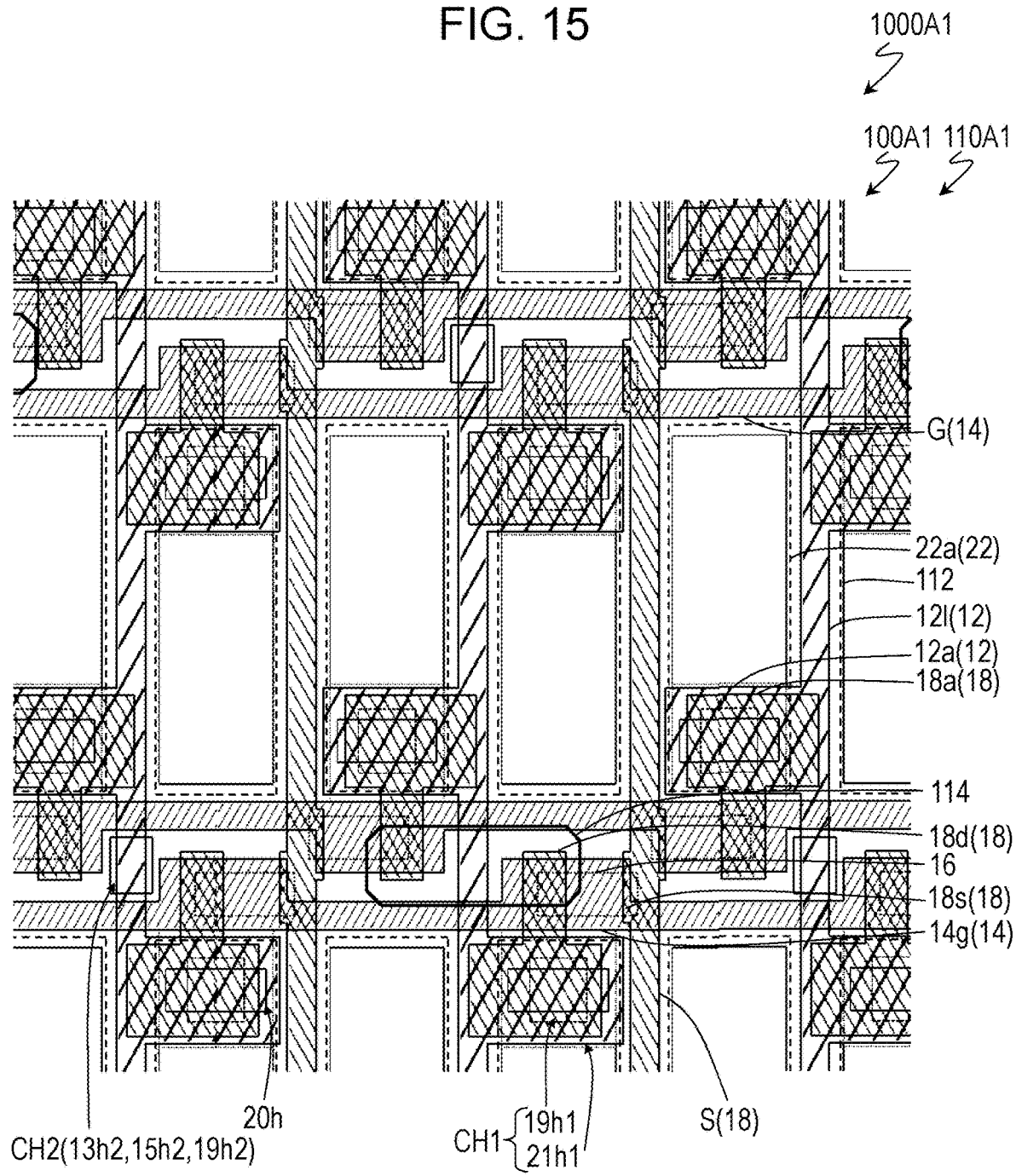
FIG. 15 is a plan view schematically illustrating a liquid crystal display apparatus 1000A1 including an active matrix substrate 100A1 of a modification example of Embodiment 1.

An active matrix substrate of a modification example of the present embodiment will be described with reference to FIG. 15. FIG. 15 is a plan view schematically illustrating a liquid crystal display apparatus 1000A1 including an active matrix substrate 100A1 of the modification example of the present embodiment. The liquid crystal display apparatus 1000A1 includes the active matrix substrate 100A1, a counter substrate 110A1, and the liquid crystal layer (not shown).

As illustrated in FIG. 15, the active matrix substrate 100A1 differs from the active matrix substrate 100A in the disposition of the plurality of contact holes CH2. In the active matrix substrate 100A, the contact holes CH2 are provided for every pixel row in the column direction and every two pixel columns in the row direction. In contrast, in the active matrix substrate 100A1 of the modification example, the contact hole CH2 is provided for every two pixel rows in the column direction and every four pixel columns in the row direction.

Also in the active matrix substrate having such a structure, the same effect as that of the active matrix substrate 100A can be obtained.

Further, the present embodiment is not limited thereto, and the contact hole CH2 may be provided at any rate. In the active matrix substrate having the dual gate drive structure, the contact hole CH2 may be provided, for example, for every n pixel rows (n is the integer) in the column direction and every 2×n pixel columns in the row direction.

As illustrated in FIG. 15, the counter substrate 110A1 differs from the counter substrate 110A illustrated in FIG. 8 in the disposition of the plurality of columnar spacers 114. In the counter substrate 110A, the columnar spacer 114 is provided for every two pixel rows in the column direction and every two pixel columns in the row direction. In contrast, in the active matrix substrate 100A1 of the modification example, the columnar spacer 114 is provided for every two pixel rows in the column direction and every four pixel columns in the row direction.

Further, the present embodiment is not limited thereto, and the columnar spacer 114 may also be provided at any rate. In the active matrix substrate having the dual gate drive structure, the columnar spacer 114 may be provided, for example, for every n pixel rows (n is the integer) in the column direction and every 2×n pixel columns in the row direction. In addition, the shape of the columnar spacer 114 is not limited to the one that is illustrated, and may be any shape such as a substantially circular shape, a square shape, and a polygonal shape.

As illustrated in FIG. 15, it is preferable that the contact hole CH2 and the columnar spacer 114 are formed not to overlap when viewed in the normal direction of the substrate 11. When the liquid crystal display apparatus has such a configuration, an unevenness of the surface of the active matrix substrate can be reduced in a portion including the columnar spacer 114. Accordingly, the number of the columnar spacer provided to control the thickness of the liquid crystal layer uniformly can be reduced.

Embodiment 2

In Embodiment 1, the plurality of CS bus lines and auxiliary capacitor electrodes are formed by the lower metal layer 12. In contrast, in the present embodiment, the plurality of CS bus lines and/or the auxiliary capacitor electrodes include the lower metal layer 12 and the gate metal layer 14.

Figure 16:
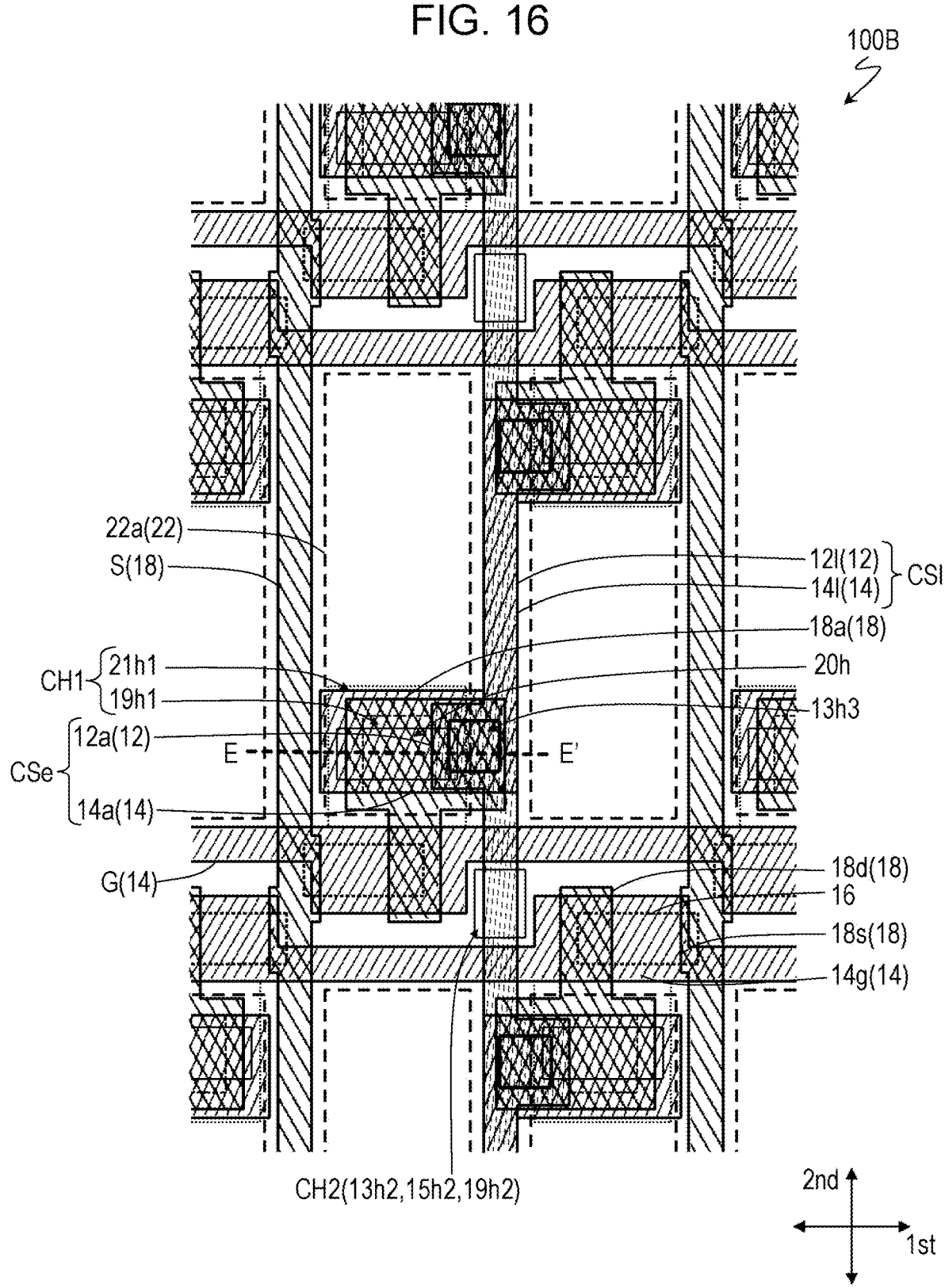
FIG. 16 is a plan view schematically illustrating an active matrix substrate 100B according to Embodiment 2 of the present invention.
Figure 17:
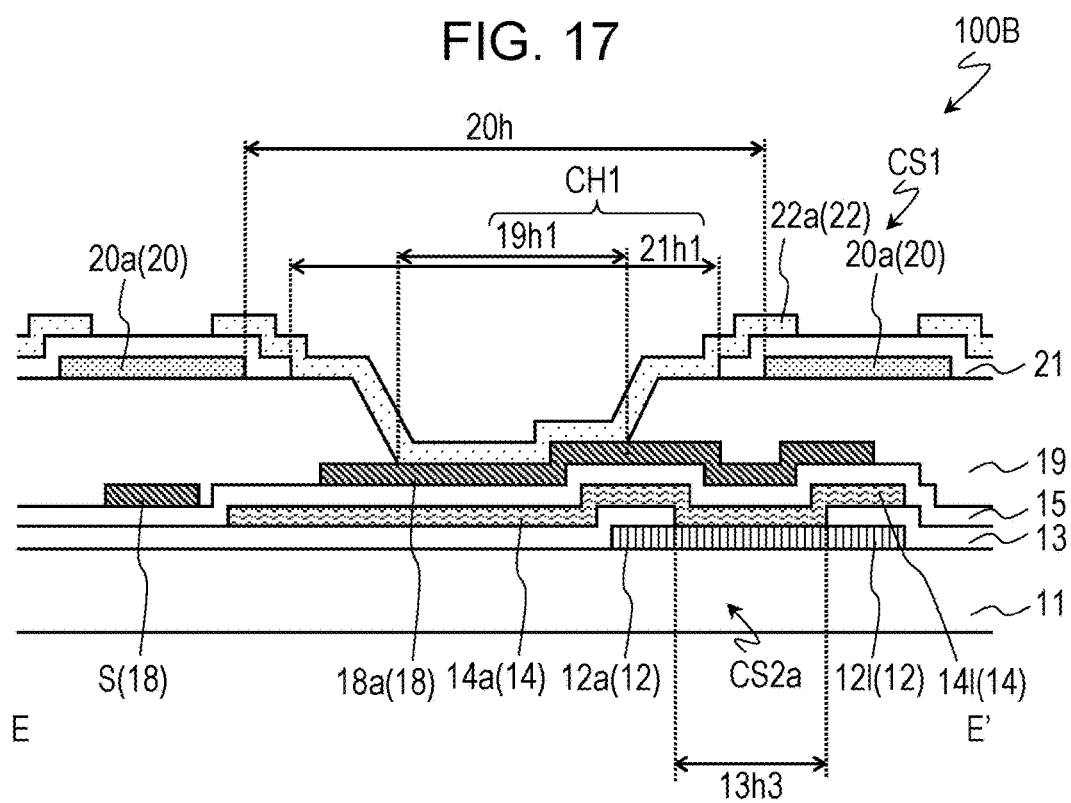
FIG. 17 is a sectional view schematically illustrating the active matrix substrate 100B, and illustrates a sectional structure taken along the line E-E' in FIG. 16.
Figure 18:
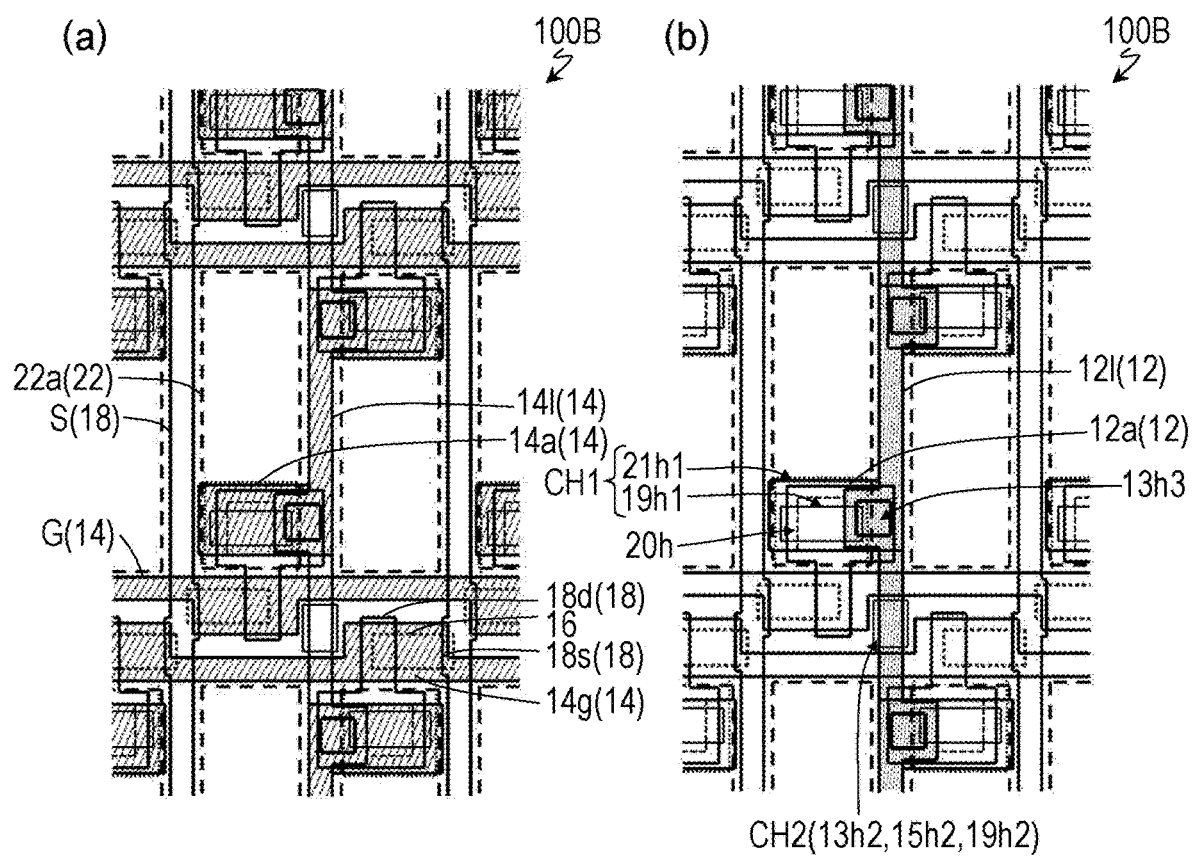
FIGS. 18(a) and 18(b) are plan views schematically illustrating the active matrix substrate 100B.

FIGS. 16, 17, and 18 illustrate an active matrix substrate 100B in the present embodiment. FIG. 16 is a plan view schematically illustrating the active matrix substrate 100B, and FIG. 17 is a sectional view schematically illustrating the active matrix substrate 100B. FIG. 17 illustrates a sectional structure taken along the line E-E' in FIG. 16. FIGS. 18(a) and 18(b) are plan views schematically illustrating the active matrix substrate 100B, FIG. 18 (a) is a view in which the gate metal layer 14 is hatched, and FIG. 18(b) is a view in which the lower metal layer 12 is hatched. The following description will focus on differences between the active matrix substrate 100B and the active matrix substrate 100A in Embodiment 1.

As illustrated in FIGS. 16, 17, and 18, the active matrix substrate 100B extends in the column direction and have a plurality of CS bus lines CS1 that do not overlap the plurality of source bus lines S when viewed in the normal direction of the substrate 11. The plurality of CS bus lines CS1 include the lower metal layer 12 and the gate metal layer 14. An auxiliary capacitor electrode CSe of each pixel P includes the lower metal layer 12 and the gate metal layer 14. The auxiliary capacitor electrode CSe is electrically connected to at least any one of the plurality of CS bus lines CS1, and overlaps the drain extension section 18a when viewed in the normal direction of the substrate 11.

Here, as illustrated in FIG. 17, an auxiliary capacitor CS2a is constituted by the gate metal layer 14a of the auxiliary capacitor electrode CSe, the drain extension section 18a, and the gate insulating layer 15 positioned therebetween. Each of the plurality of pixels P is formed in the lower insulating layer 13 and has an opening 13h3 reaching the lower metal layer 12 of the auxiliary capacitor electrode CSe. The gate metal layer 14 of the auxiliary capacitor electrode CSe is formed to cover the opening 13h3.

The active matrix substrate 100B has the first auxiliary capacitor CS1 and the second auxiliary capacitor CS2a formed to be electrically connected (for example, connected in parallel) to the liquid crystal capacitor of each pixel P, and thus it is possible to improve the display quality of the liquid crystal display apparatus including the active matrix substrate 100B.

The active matrix substrate 100B of the present embodiment has the two-layer electrode structure. Furthermore, the plurality of CS bus lines CS1 and the auxiliary capacitor electrodes CSe are mainly provided in the region that does not contribute to display. The active matrix substrate 100B can secure the auxiliary capacitance value and can improve the display quality while suppressing the decrease in the aperture ratio of the liquid crystal display apparatus.

Further, since the plurality of CS bus lines CS1 are formed not to overlap the source bus line S, the active matrix substrate 100B also has the advantage of being able to secure the auxiliary capacitance value without increasing the source bus line load. Therefore, the active matrix substrate 100B can improve the display quality of the liquid crystal display apparatus while suppressing the increase in the source bus line load.

Furthermore, the active matrix substrate 100B can increase the auxiliary capacitance value of each pixel as compared to the active matrix substrate 100A. In the active matrix substrate 100A, an auxiliary capacitor CS2 is constituted by the auxiliary capacitor electrode 12a, the drain extension section 18a, and the lower insulating layer 13 and the gate insulating layer 15 positioned therebetween. In contrast, in the active matrix substrate 100B, the auxiliary capacitor CS2a is constituted by the gate metal layer 14a of the auxiliary capacitor electrode CSe, the drain extension section 18a, and the gate insulating layer 15 positioned therebetween. Since the thickness of the dielectric layer constituting the auxiliary capacitor can be reduced, the auxiliary capacitance value can be increased.

The CS bus line CS1 of the active matrix substrate 100B has the lower metal layer 12 and the gate metal layer 14, and thus can have a redundancy. Here, the CS bus line CS1 has the lower metal layer 12 and the gate metal layer 14 in a portion adjacent to the pixel electrode 22a, and in the portion, the lower metal layer 12 and the gate metal layer 14 are connected to each other in at least two points, and thus the CS bus line CS1 has the redundancy. That is, even when a disconnection occurs in either the lower metal layer 121 of the CS bus line CS1 or the gate metal layer 141 of the CS bus line CS1, an operation of the active matrix substrate 100B is not disturbed. In addition, since the CS bus line CS1 has the lower metal layer 12 and the gate metal layer 14, an electric resistance (wiring resistance) of the entire CS bus line CS1 reduces.

The present embodiment is not limited to the illustrated example, and is adoptable as long as at least one of the auxiliary capacitor electrode CSe and the plurality of CS bus lines CS1 includes the lower metal layer 12 and the gate metal layer 14. In the auxiliary capacitor electrodes CSe, it is preferable that the portion overlapping the drain extension section 18a when viewed in the normal direction of the substrate 11 includes the gate metal layer 14. In this case, since the thickness of the dielectric layer constituting the auxiliary capacitor can be at least partially reduced, the auxiliary capacitance value can be increased.

Embodiment 3

The active matrix substrates of Embodiments 1 and 2 are suitably used, for example, in a liquid crystal display apparatus in the TN mode or the VA mode. In contrast, the active matrix substrate of the present embodiment is suitably used, for example, in a liquid crystal display apparatus in the FFS mode.

Figure 19:
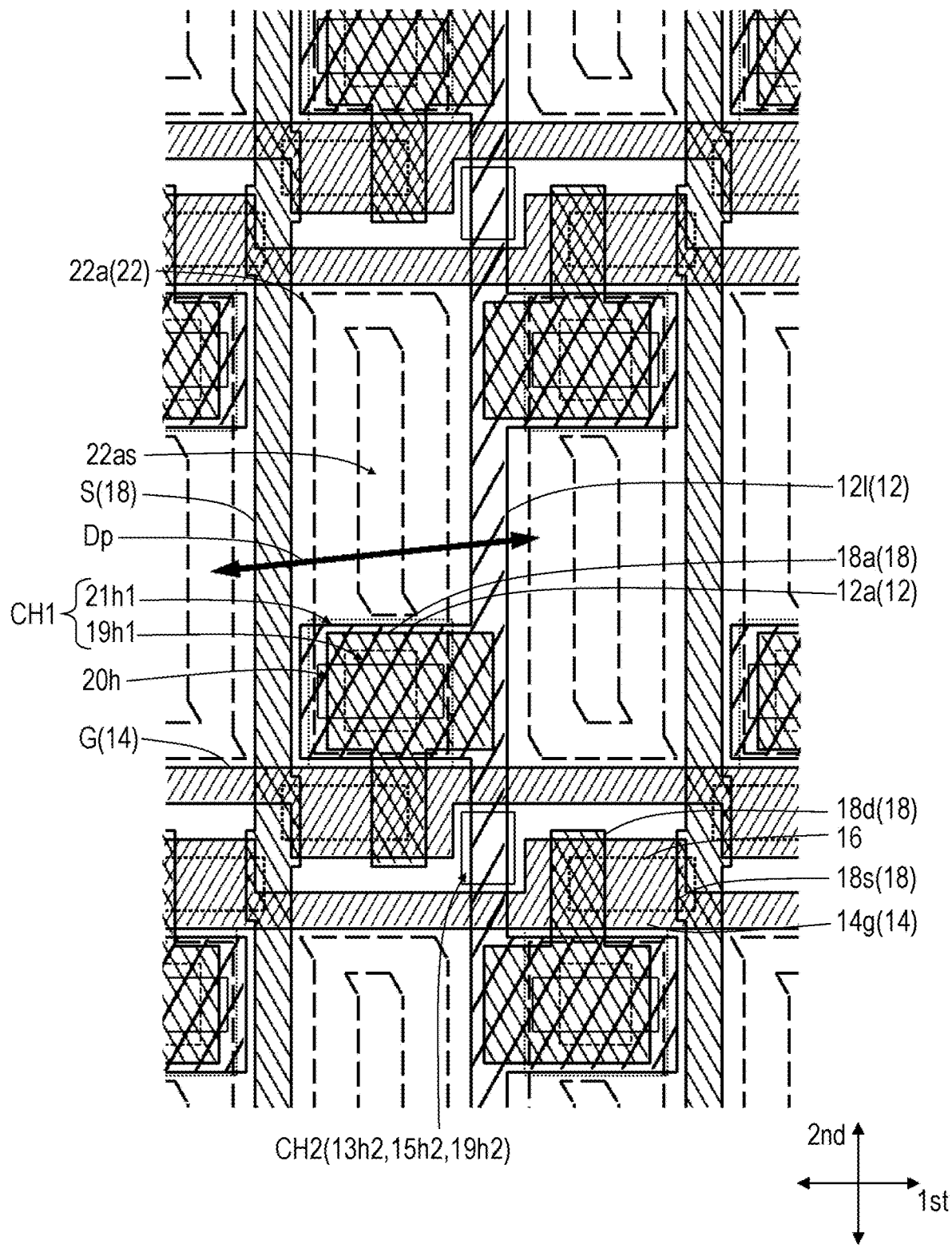
FIG. 19 is a plan view schematically illustrating an active matrix substrate 100C according to Embodiment 3 of the present invention.
Figure 20:
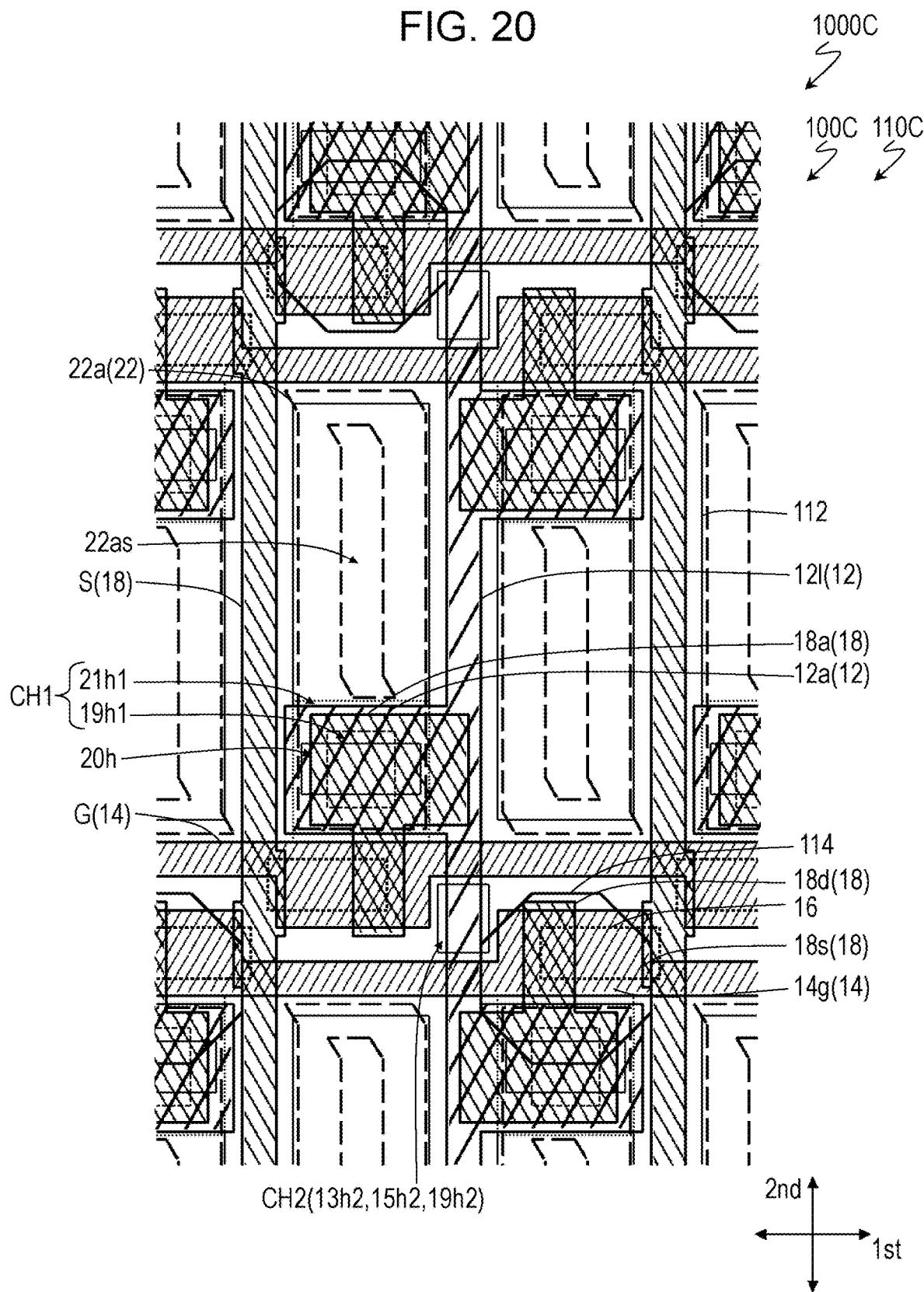
FIG. 20 is a plan view schematically illustrating a liquid crystal display apparatus 1000C including the active matrix substrate 100C.

FIGS. 19 and 20 illustrate an active matrix substrate 100C and a liquid crystal display apparatus 1000C including the active matrix substrate 100C in the present embodiment. FIG. 19 is a plan view schematically illustrating the active matrix substrate 100C, and FIG. 20 is a plan view schematically illustrating the liquid crystal display apparatus 1000C. The liquid crystal display apparatus 1000C includes the active matrix substrate 100C, a counter substrate 110C, and the liquid crystal layer (not shown). The following description will focus on the differences between the active matrix substrate 100C and the active matrix substrate 100A in Embodiment 1. The liquid crystal display apparatus 1000A of Embodiment 1 is, for example, a liquid crystal display apparatus in the TN mode or the VA mode. In contrast, the liquid crystal display apparatus 1000C of the present embodiment is, for example, the liquid crystal display apparatus in the FFS mode.

As illustrated in FIGS. 19 and 20, in the active matrix substrate 100C, the first transparent electrode 20a functions as the common electrode (also referred to as the "counter electrode"), and the pixel electrode 22a and the common electrode 20a constitute an electrode pair that generates the lateral electric field in the liquid crystal layer. The liquid crystal capacitor is constituted by the pixel electrode 22a, the common electrode 20a, and the liquid crystal layer. The pixel electrode 22a has at least one slit 22a s. In the illustrated example, each pixel electrode 22a has one slit 22a s. Without being limited to this, each pixel electrode 22a may have a plurality of slits extending in parallel to one another. A width of the slit 22a s is, for example, approximately 2 µm to 4 µm.

In the liquid crystal display apparatus in the lateral electric field mode, an electric field is generated, the electric field being represented by the electric lines of force emanating from the pixel electrode 22a, passing through the liquid crystal layer (not shown), further passing through the slits 22as of the pixel electrode 22a, and entering the common electrode 20a. This electric field has a lateral component with respect to the liquid crystal layer. As a result, the electric field in the lateral direction can be applied to the liquid crystal layer. In the lateral electric field type, the amount of the component of liquid crystal molecules rising from the substrate is small, which is the advantage of being able to realize a wide viewing angle as compared with a longitudinal electric field type.

The counter substrate 110C does not have the counter electrode, which differs from the counter substrate 110A.

Since the active matrix substrate 100C has the first auxiliary capacitor CS1 and the second auxiliary capacitor CS2 formed to be electrically connected (for example, connected in parallel) to the liquid crystal capacitor of each pixel P, it is possible to improve the display quality of the liquid crystal display apparatus including the active matrix substrate 100C.

The active matrix substrate 100C of the present embodiment has the two-layer electrode structure. Furthermore, the plurality of CS bus lines 121 and the auxiliary capacitor electrodes 12a are mainly provided in the region not contributing to the display. The active matrix substrate 100C can secure the auxiliary capacitance value and can improve the display quality while suppressing the decrease in the aperture ratio of the liquid crystal display apparatus.

Further, since the plurality of CS bus lines 121 are formed not to overlap the source bus line S, the active matrix substrate 100C has the advantage of being able to secure the auxiliary capacitance value without increasing the source bus line load. Accordingly, the active matrix substrate 100C can improve the display quality of the liquid crystal display apparatus while suppressing an increase in the source bus line load.

The liquid crystal layer of the liquid crystal display apparatus 1000C includes a nematic liquid crystal material having a negative dielectric anisotropy. Since the molecules of the nematic liquid crystal having the negative dielectric anisotropy are aligned such that a long axis of the molecule (parallel to the director) to be orthogonal to the electric field, the alignment direction of the liquid crystal molecules when no electric field is applied may be regulated to be substantially parallel to the direction of the lateral electric field (a direction orthogonal to a direction in which the slit extends). Here, since the pixel electrode 22a has the slit 22a s extending in the column direction (that is, the slit 22a s extends parallel to the source bus line S), the lateral electric field is formed in the row direction (that is, the lateral electric field is formed in a direction parallel to the gate bus line G). The alignment direction of liquid crystal molecules when no electric field is applied is regulated by an alignment treatment (for example, the rubbing treatment or a photo-alignment treatment) of the alignment film of the active matrix substrate 100C and the counter substrate 110C. As illustrated in the drawing, an alignment control direction Dp regulated by the alignment film of the active matrix substrate 100C and the counter substrate 110C is preferably regulated to form an angle of more than 0° (for example, an angle of approximately 3° to 8°) with respect to the direction of the lateral electric field. Accordingly, the direction (counterclockwise or clockwise) in which the liquid crystal molecules rotate can be regulated by the lateral electric field when the voltage is applied. In addition, the response speed of liquid crystal molecules when the voltage is applied can be improved. The alignment control directions regulated by the alignment films of the active matrix substrate 100C and the counter substrate 110C are parallel or antiparallel.

The liquid crystal layer of the liquid crystal display apparatus of the present embodiment is not limited to the one including the nematic liquid crystal having the negative dielectric anisotropy, and may include a nematic liquid crystal having a positive dielectric anisotropy. In a case where the nematic liquid crystal material having the positive dielectric anisotropy is used, the alignment direction of liquid crystal molecules when no electric field is applied, may be rotated by 90° from a case where the nematic liquid crystal material having the negative dielectric anisotropy is used. In addition, the pixel electrode 22a may have the slit extending in the row direction. In a case where the pixel electrode 22a has the slit extending in the row direction, the alignment direction of the liquid crystal molecules when no electric field is applied, may be rotated by 90° from a case where the pixel electrode 22a has the slit extending in the column direction.

Note that, from the viewpoint of suppressing the display quality, as described above, the liquid crystal display apparatus 1000C preferably has the liquid crystal layer including the nematic liquid crystal having the negative dielectric anisotropy, and the pixel electrode 22a having the slit 22as extending in the column direction. The alignment film around the columnar spacer (in particular, the portion behind the spacer with respect to the rubbing direction, that is, the downstream side of the rubbing direction) may not be sufficiently rubbed to cause the alignment disorder of the liquid crystal molecules. When the region in which the alignment treatment is not sufficiently performed reaches a region where the black matrix 112 is not formed, the display quality may decrease. In particular, in the liquid crystal display apparatus that performs the display in the normally black mode, light leakage may occur in the black display state, and a decrease in contrast may occur. Since in the liquid crystal display apparatus 1000C, most of shadowed portions of the columnar spacers when the alignment treatment is performed are covered by the black matrix 112, it is possible to suppress the decrease in the display quality caused by a fact that the alignment film around the spacer is not sufficiently subjected to the alignment treatment, without increasing the area of the black matrix, that is, without decreasing the aperture ratio.

The active matrix substrate of the present embodiment is not limited to the illustrated one. For example, as in the active matrix substrate 100B of Embodiment 2, the plurality of CS bus lines and/or auxiliary capacitor electrodes may include the lower metal layer 12 and the gate metal layer 14.

Embodiment 4

The active matrix substrate of the present embodiment includes an oxide semiconductor TFT (a TFT using an oxide semiconductor layer as the active layer) and a crystalline silicon TFT (a TFT using a crystalline silicon layer as the active layer) formed on the same substrate.

The active matrix substrate of the present embodiment has, for the TFT (sometimes referred to as a "pixel TFT") of each pixel, for example, an oxide semiconductor TFT having an In—Ga—Zn—O-based semiconductor film as an active layer. Part or the whole of a peripheral drive circuit is integrally formed on the same substrate as the pixel TFT. Such an active matrix substrate is called a driver monolithic active matrix substrate. In the driver monolithic active matrix substrate, the peripheral drive circuit is provided in the region (the non-display region or the picture-frame region) other than the region (the display region) including the plurality of pixels. For example, a crystalline silicon TFT having a polycrystalline silicon film as an active layer is used for a TFT (sometimes referred to as a "circuit TFT") constituting the peripheral drive circuit. As described above, when the oxide semiconductor TFT is used for the pixel TFT and the crystalline silicon TFT is used for the circuit TFT, the power consumption can be small in the display region, and furthermore, the picture-frame region can be small.

Figure 21:
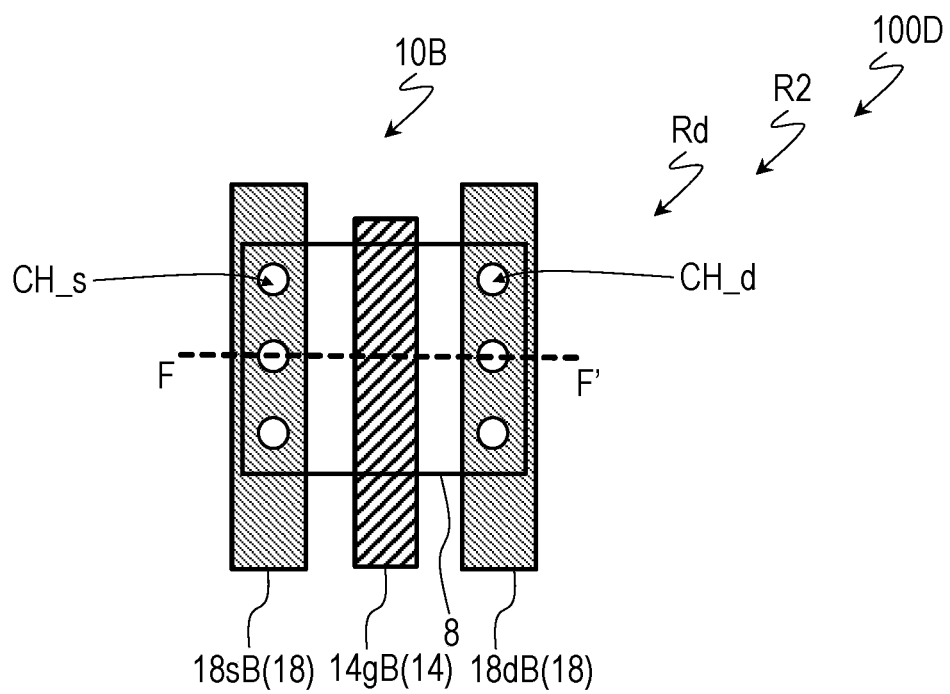
FIG. 21 is a schematic plan view of a non-display region R2 of an active matrix substrate 100D according to Embodiment 4 of the present invention.
Figure 22:
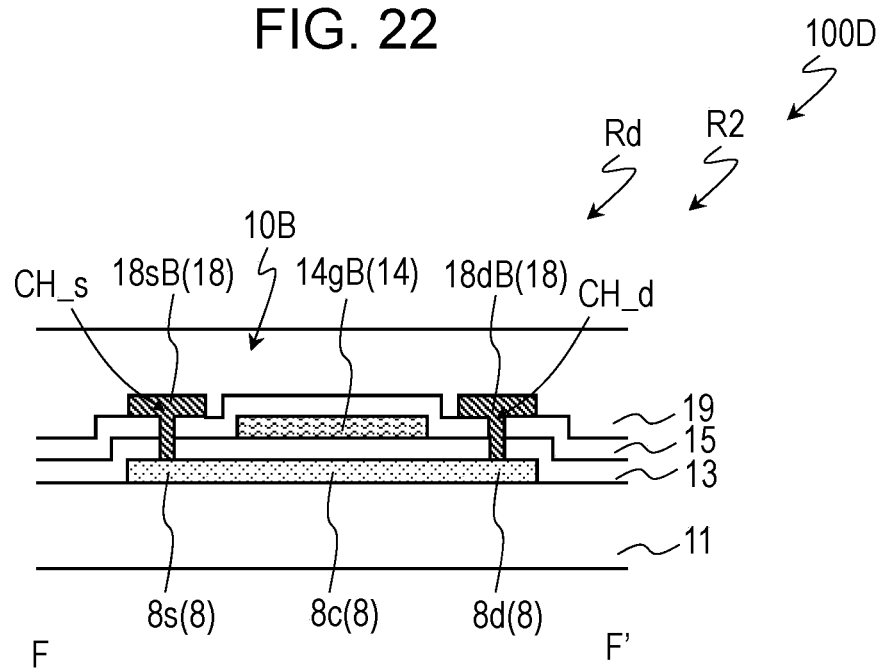
FIG. 22 is a schematic sectional view of a non-display region R2 of the active matrix substrate 100D, and illustrates a sectional structure taken along the line F-F' in FIG. 21.

FIGS. 21 and 22 illustrate an active matrix substrate 100D of the present embodiment. FIGS. 21 and 22 are respectively a schematic plan view and a schematic sectional view of a non-display region R2 of the active matrix substrate 100D. FIG. 22 illustrates a sectional structure taken along the line F-F' in FIG. 21.

A display region R1 of the active matrix substrate 100D has basically the same structure as the display region R1 of the active matrix substrate 100A of Embodiment 1 described with reference to FIGS. 1, 2, 3, and 4. However, the TFT 10 (pixel TFT 10) included in each pixel P is an oxide semiconductor TFT. In the description of the display region of the active matrix substrate 100D, references may be made to FIGS. 1, 2, 3, and 4.

As illustrated in FIGS. 21 and 22, the non-display region R2 of the active matrix substrate 100D includes a drive circuit formation region Rd in which the drive circuit is provided. For example, a gate driver circuit, an inspection circuit, and the like are provided in the drive circuit formation region Rd.

As illustrated in FIGS. 21 and 22, in the active matrix substrate 100D, a crystalline silicon TFT 10B (hereinafter sometimes referred to as a "second thin film transistor 10B") is formed as a circuit TFT 10B in the drive circuit formation region Rd. In each pixel of the display region R1 of the active matrix substrate 100D, an oxide semiconductor TFT 10 (hereinafter sometimes referred to as a "first thin film transistor 10") is formed as the pixel TFT 10.

The active matrix substrate 100D includes a substrate 11, the first thin film transistor 10 formed on the substrate 11, and the second thin film transistor 10B formed on the substrate 11. The second thin film transistor 10B has an active region mainly including the crystalline silicon. The first thin film transistor 10 has an active region mainly including the oxide semiconductor. The second thin film transistor 10B and the first thin film transistor 10 are integrally formed on the substrate 11. Here, the "active region" refers to a region in which a channel is formed in the semiconductor layer to be the active layer of the TFT.

As illustrated in FIG. 22, the second thin film transistor 10B includes a crystalline silicon semiconductor layer (for example, a low temperature polysilicon layer) 8 formed on the substrate 11, and the lower insulating layer 13 covering the crystalline silicon semiconductor layer 8, a gate electrode 14gB provided on the lower insulating layer 13 and formed to overlap the crystalline silicon semiconductor layer 8 with the lower insulating layer 13 interposed therebetween, and the insulating layer 15 (the gate insulating layer 15) covering the gate electrode 14gB, and a source electrode 18sB and a drain electrode 18dB connected to the crystalline silicon semiconductor layer 8.

The crystalline silicon semiconductor layer 8 has a region (referred to as an "active region" or a "channel region") 8c in which the channel is formed, and a source region 8s and a drain region 8d positioned on both sides of the active region. In the crystalline silicon semiconductor layer 8 of this example, a portion overlapping the gate electrode 14gB with the lower insulating layer 13 interposed therebetween is the active region 8c.

In the lower insulating layer 13, a portion positioned between the crystalline silicon semiconductor layer 8 and the gate electrode 14gB functions as a gate insulating film of the second thin film transistor 10B.

The gate electrode 14gB is included in the gate metal layer 14.

The source electrode 18sB and the drain electrode 18dB are included in the source metal layer 18. The source electrode 18sB and the drain electrode 18dB are respectively connected to the source region 8s and the drain region 8d. The source electrode 18sB and the drain electrode 18dB may be provided on the interlayer insulating film (here, the gate insulating layer 15) covering the gate electrode 14gB and the crystalline silicon semiconductor layer 8, so as to be connected to the crystalline silicon semiconductor layer 8 in contact holes CH_s and CH_d formed on the interlayer insulating film (the gate insulating layer 15) and the lower insulating layer 13.

The second thin film transistor 10B is covered with the interlayer insulating layer 19. The inorganic insulating layer 21 may be formed on the second thin film transistor 10B.

The first thin film transistor 10 has the same structure as the pixel TFT 10 of the active matrix substrate 100A illustrated in FIG. 3, and thus the description is omitted.

In the illustrated example, the second thin film transistor 10B has a top gate structure in which the crystalline silicon semiconductor layer 8 is disposed between the gate electrode 14gB and the substrate 11. Meanwhile, the first thin film transistor 10 has a bottom gate structure in which the gate electrode 14g is disposed between the oxide semiconductor layer 16 and the substrate 11. By adopting such a structure, when the two types of the thin film transistors 10 and 10B are integrally formed on the same substrate 11, the increase in the number of manufacturing steps and the manufacturing cost can be more effectively suppressed.

The TFT structures of the second thin film transistor 10B and the first thin film transistor 10 are not limited to the above description. For example, the second thin film transistor 10B may further have the gate electrode included in the lower metal layer 12 (the double gate structure).

The gate insulating layer 15 which is the gate insulating film of the first thin film transistor 10 may extend to a region where the second thin film transistor 10B is formed, so as to function as the interlayer insulating film covering the gate electrode 14gB of the second thin film transistor 10B and the crystalline silicon semiconductor layer 8. In this way, in a case where the interlayer insulating film of the second thin film transistor 10B and the gate insulating film of the first thin film transistor 10 are formed in the same layer (here, the gate insulating layer 15), the gate insulating layer 15 may have the stacked structure.

Here, the gate electrode 14gB of the second thin film transistor 10B and the gate electrode 14g of the first thin film transistor 10 are formed in the same layer (in the gate metal layer 14). In addition, here, the source electrode 18sB and the drain electrode 18dB of the second thin film transistor 10B, and the source electrode 18s and the drain electrode 18d of the first thin film transistor 10 are formed in the same layer (in the source metal layer 18). The expression "formed in the same layer" means a case of being formed using the same film (the conductive film). Accordingly, it is possible to suppress the increase in the number of manufacturing steps and the manufacturing cost.

The active matrix substrate 100D has the first auxiliary capacitor CS1 and the second auxiliary capacitor CS2 formed to be electrically connected (for example, connected in parallel) to the liquid crystal capacitor of each pixel P, and thus can improve the display quality of the liquid crystal display apparatus including the active matrix substrate 100D.

The active matrix substrate 100D of the present embodiment has the two-layer electrode structure. Furthermore, the plurality of CS bus lines 121 and the auxiliary capacitor electrodes 12a are mainly provided in the region not contributing to the display. The active matrix substrate 100D can secure the auxiliary capacitance value and can improve the display quality while suppressing the decrease in the aperture ratio of the liquid crystal display apparatus.

Further, since the plurality of CS bus lines 121 are formed not to overlap the source bus line S, the active matrix substrate 100D also has the advantage of being able to secure the auxiliary capacitance value without increasing the source bus line load. Therefore, the active matrix substrate 100D can improve the display quality of the liquid crystal display apparatus while suppressing the increase in the source bus line load.

The active matrix substrate 100D may further have an insulating layer between the substrate 11 and the crystalline silicon semiconductor layer 8. The insulating layer formed between the substrate 11 and the crystalline silicon semiconductor layer 8 may be formed in the display region R1 and the non-display region R2.

The crystalline silicon semiconductor layer 8 may be formed between the lower metal layer 12 and the lower insulating layer 13 or may be formed below the lower metal layer 12.

The display region of the active matrix substrate 100D of the present embodiment has the same structure as the display region R1 of the active matrix substrate 100A of Embodiment 1; however, the present embodiment is not limited thereto. The display region of the present embodiment may have the same structure as the display region of the active matrix substrate of another embodiment. In this case as well, the same effect as that of the active matrix substrate 100D can be obtained.

Modification Example 1

An active matrix substrate of Modification Example 1 of the present embodiment will be described with reference to FIGS. 23, 24, 25, and 26.

Figure 23:
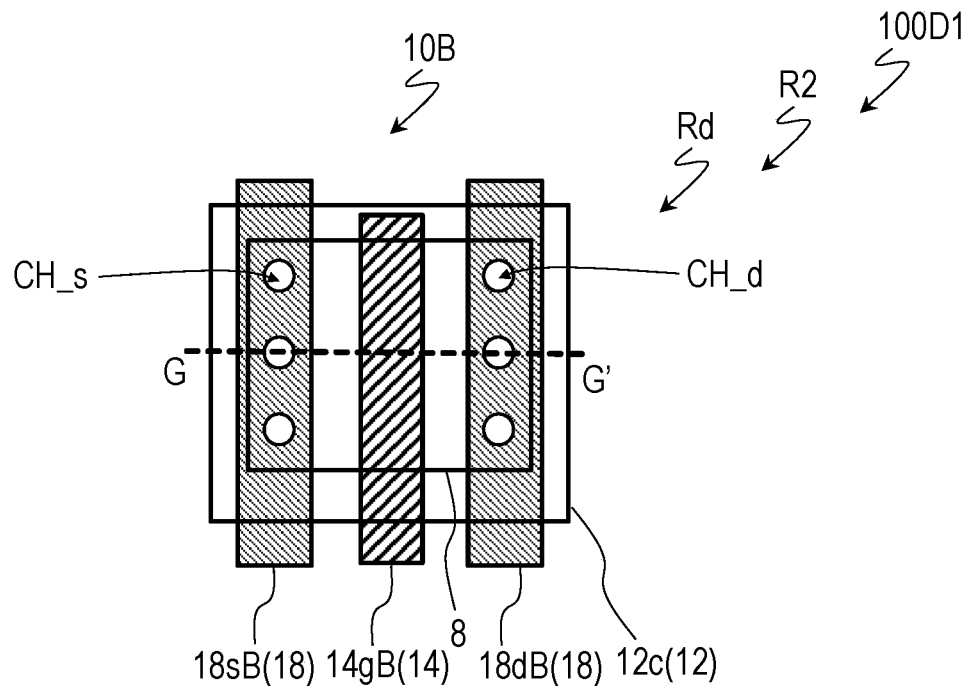
FIG. 23 is a schematic plan view of a non-display region R2 of an active matrix substrate 100D1 according to Modification Example 1 of Embodiment 4 of the present invention.
Figure 24:
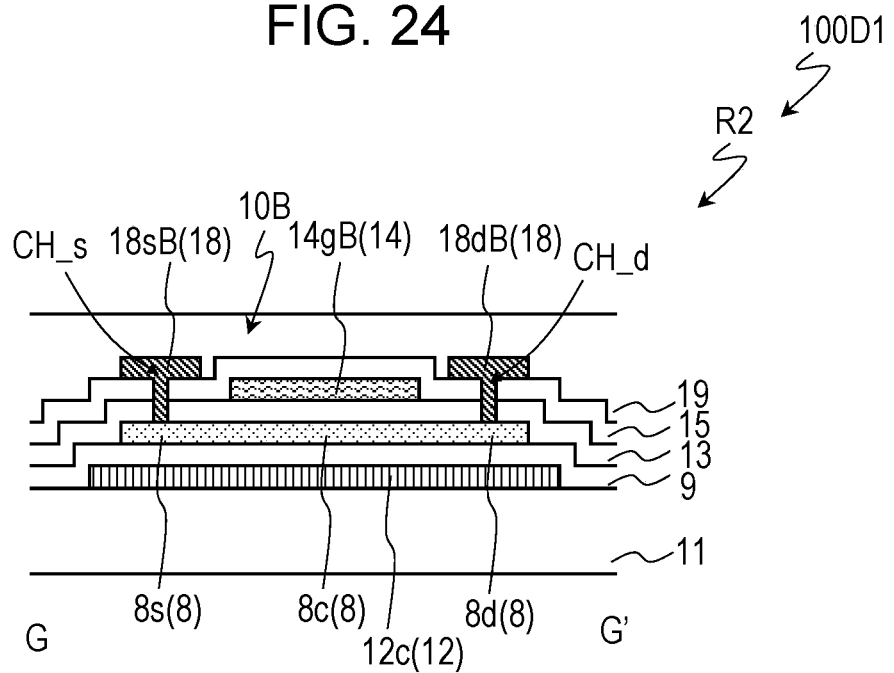
FIG. 24 is a schematic sectional view of the non-display region R2 of the active matrix substrate 100D1, and illustrates a sectional structure taken along the line G-G' in FIG. 23.
Figure 25:
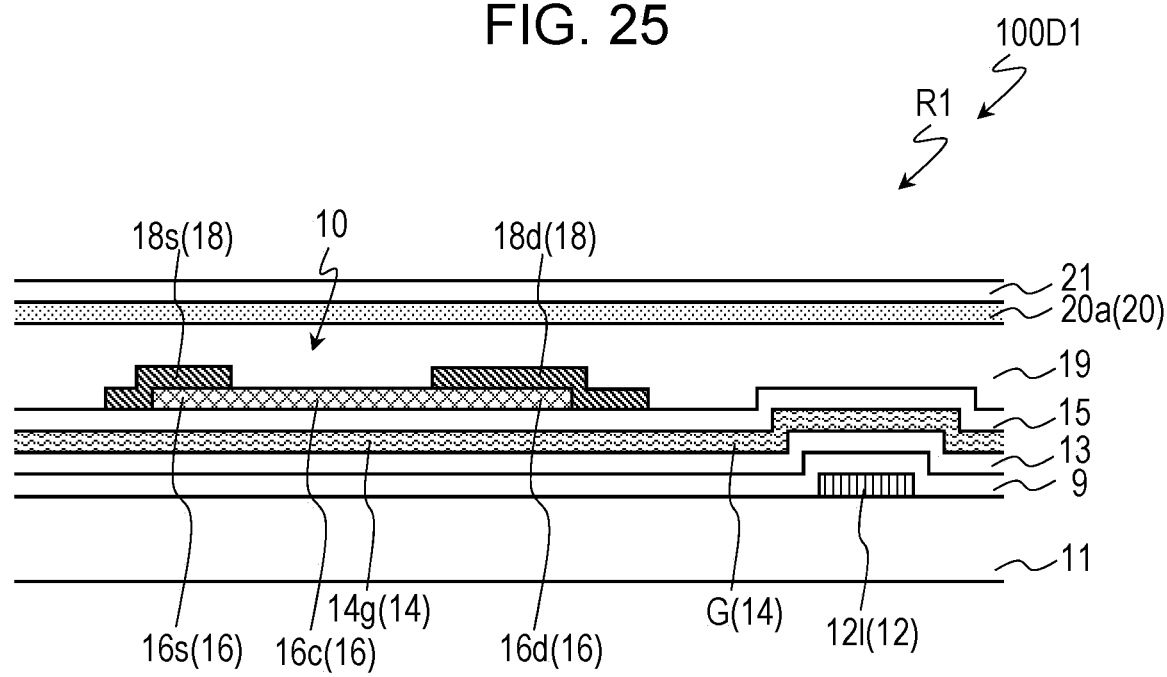
FIG. 25 is a schematic sectional view of a display region R1 of the active matrix substrate 100D1.
Figure 26:
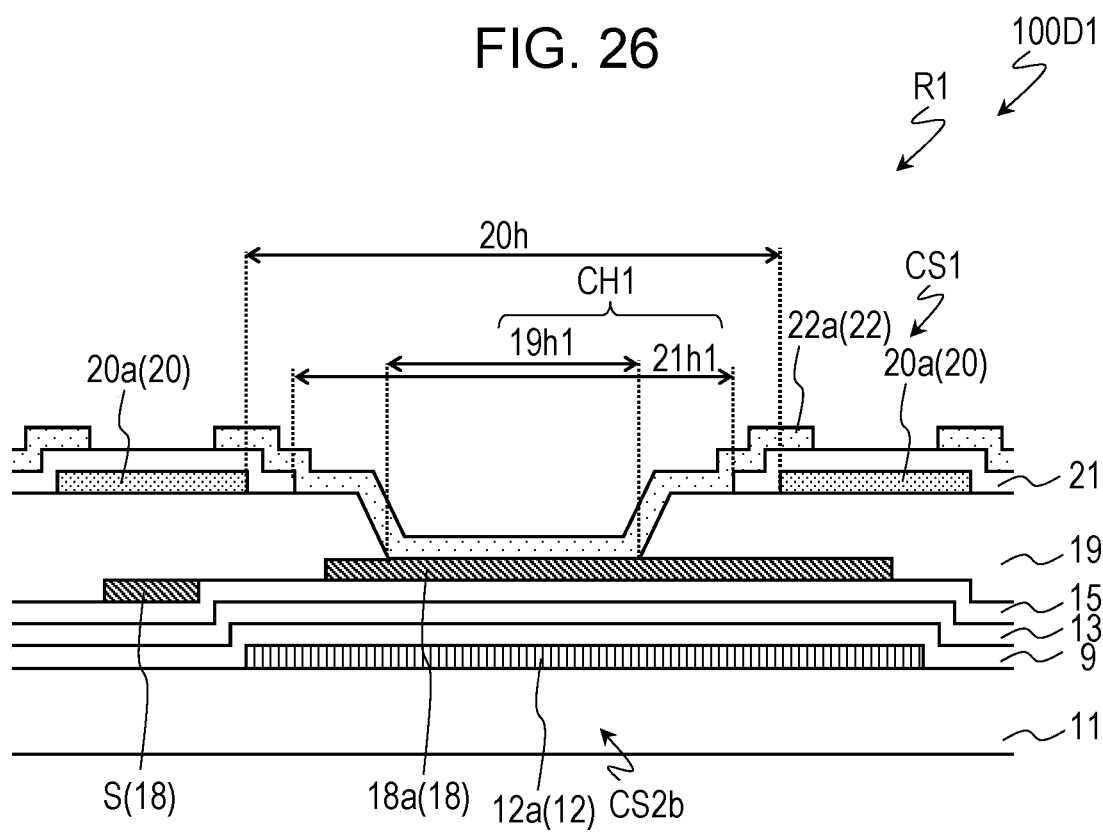
FIG. 26 is a schematic sectional view of the display region R1 of the active matrix substrate 100D1.

FIGS. 23, 24, 25, and 26 illustrate an active matrix substrate 100D1 of Modification Example 1 of the present embodiment. FIGS. 23 and 24 are respectively a schematic plan view and a schematic sectional view of a non-display region R2 of the active matrix substrate 100D1. FIG. 24 illustrates a sectional structure taken along the line G-G' in FIG. 23. FIGS. 25 and 26 are sectional views schematically illustrating a display region R1 of the active matrix substrate 100D1.

The active matrix substrate 100D1 further has a lower light shielding section 12c formed to cover the channel region 8c of the crystalline silicon semiconductor layer 8 of the circuit TFT 10B (the second thin film transistor 10B) when viewed in the normal direction of the substrate 11, as illustrated in FIGS. 23 and 24, which differs from the active matrix substrate 100D. The lower light shielding section 12c is included in the lower metal layer 12 and is formed in an island shape.

Also in the active matrix substrate 100D1 having such a structure, the same effect as that of the active matrix substrate 100D can be obtained.

In the active matrix substrate 100D1, the lower light shielding section 12c functions as a light shielding film of the crystalline silicon semiconductor layer 8, and can restrain the backlight from being incident on the crystalline silicon semiconductor layer 8.

Typically, when light is radiated to the semiconductor layer and is absorbed, electrons are excited in a conduction band and holes are excited in a valence band by a photoelectric effect, and an electron-hole pair is generated. Therefore, when light is radiated to the channel region of the semiconductor layer, photocurrent is generated due to the electron-hole pair, and the leak current of the TFT increases, which causes crosstalk, a decrease in contrast ratio, or the like. In particular, this problem is likely to occur in high resolution liquid crystal display apparatuses. As the high resolution of the liquid crystal display apparatus has been advanced, a pixel aperture ratio (the ratio of the total area of pixel openings in the display region) becomes small, and thus there is a tendency that it becomes difficult to obtain a sufficient display luminance. Therefore, in order to increase the display luminance, the luminance of the backlight is often caused to be increased.

The active matrix substrate 100D1 has the lower light shielding section 12c that functions as the light shielding film of the crystalline silicon semiconductor layer 8, which is the advantage of being able to suppress the occurrence of the above problem.

However, as described below, the second auxiliary capacitor CS2b formed in each pixel of the active matrix substrate 100D1 has a smaller capacitance value than the second auxiliary capacitor CS2 of the active matrix substrate 100D.

The active matrix substrate 100D1 further has an insulating layer 9 formed between the lower insulating layer 13 and the lower metal layer 12. The semiconductor layer 8 is formed between the further insulating layer 9 and the lower insulating layer 13.

The structure of the display region R1 of the active matrix substrate 100D1 will be described with reference to FIGS. 25 and 26.

FIGS. 25 and 26 are views corresponding to the sectional structure of the display region R1 of active matrix substrate 100A illustrated in FIGS. 2 and 3. As illustrated in FIGS. 25 and 26, the structure of the display region R1 of the active matrix substrate 100D1 has the further insulating layer 9 formed between the lower insulating layer 13 and the lower metal layer 12, which differs from the structure (see FIGS. 2 and 3) of the display region R1 of the active matrix substrate 100D. In each pixel of the active matrix substrate 100D1, the auxiliary capacitor electrode 12a and the drain extension section 18a, and the gate insulating layer 15, the lower insulating layer 13, and the further insulating layer 9 positioned therebetween constitute a second auxiliary capacitor CS2b.

The second auxiliary capacitor CS2b has the small auxiliary capacitance value since the thickness of the dielectric layer constituting the auxiliary capacitor is greater than that of the second auxiliary capacitor CS2 of the active matrix substrate 100D.

Modification Example 2

An active matrix substrate of Modification Example 2 of the present embodiment has the same structure as the active matrix substrate 100D in the display region, which differs from the active matrix substrate 100D1 of Modification Example 1 of the present embodiment. That is, although the non-display region of the active matrix substrate of Modification Example 2 has the further insulating layer 9, the display region does not have the further insulating layer 9. The non-display region of the active matrix substrate of Modification Example 2 has substantially the same structure as those illustrated in FIGS. 23 and 24, and the display region of the active matrix substrate of Modification Example 2 has substantially the same structure as those illustrated in FIGS. 2 and 3.

Also in the active matrix substrate having such a structure, the same effect as the active matrix substrate 100D and the active matrix substrate 100D1 can be obtained.

Furthermore, the active matrix substrate of Modification Example 2 can form the second auxiliary capacitor having a capacitance value equal to that of the second auxiliary capacitor CS2 of the active matrix substrate 100D, which is advantageous over the active matrix substrate 100D1 of Modification Example 1.

INDUSTRIAL APPLICABILITY

According to the embodiments of the present invention, it is possible to improve the display quality while suppressing the decrease in the aperture ratio of the liquid crystal display apparatus. The active matrix substrate and the liquid crystal display apparatus according to the embodiments of the present invention are suitably used, for example, in the high resolution liquid crystal display apparatus.

REFERENCE SIGNS LIST 9 semiconductor layer
8c channel region (active region)
8d drain region
8s source region
9 insulating layer
10 TFT (pixel TFT) (first thin film transistor)
10B circuit TFT (second thin film transistor)
11 substrate
12 lower metal layer
12a, CSe auxiliary capacitor electrode
12c lower light shielding section
121, CS1 CS bus line
13 lower insulating layer
13h2, 13h3 opening
14 gate metal layer
14g, 14gB gate electrode
15 gate insulating layer
15h2 opening
16 semiconductor layer
16c channel region (active region)
16d drain region
16s source region
18 source metal layer
18a drain extension section
18d, 18dB drain electrode
18s, 18sB source electrode
19 interlayer insulating layer
19h1, 19h2 opening
20 first transparent conductive layer
20a first transparent electrode (common electrode)
20h opening
21 inorganic insulating layer
21h1 opening
22 second transparent conductive layer
22a second transparent electrode (pixel electrode)
22a s slit
100A, 100A1 active matrix substrate
100B, 100C, 100D, 100D1 active matrix substrate
500A, 500B active matrix substrate
110A, 110A1, 110C counter substrate
112 black matrix
112a first light shielding section
112b second light shielding section
112o opening
114 columnar spacer
120 liquid crystal layer
130a, 130b alignment film
140, 140A, 140B gate driver circuit (gate driver)
150 source driver circuit (source driver)
1000A, 1000A1, 1000C liquid crystal display apparatus
1500A, 1500B liquid crystal display apparatus
CH1, CH2 contact hole
CS1 first auxiliary capacitor
CS2, CS2a, CS2b, CS2z second auxiliary capacitor
G, G1, G2 gate bus line
R1 display region
R2 non-display region
Rd drive circuit formation region
S source bus line

The invention claimed is:

1. An active matrix substrate that has a plurality of pixels arranged in a matrix having a plurality of rows and a plurality of columns, the active matrix substrate comprising:
a plurality of first TFTs each associated with any one of the plurality of pixels;
a plurality of gate bus lines each extending in a row direction; and
a plurality of source bus lines each extending in a column direction,
wherein the plurality of gate bus lines include a first gate bus line and a second gate bus line associated with each of the plurality of pixel rows,
wherein in each of the plurality of pixel rows, when a pixel associated with the first gate bus line is set as a first pixel, and the pixel associated with the second gate bus line is set as a second pixel, each of the plurality of source bus lines is associated with at least two pixel columns including the first pixel and the second pixel included in each of the plurality of pixel rows, wherein the active matrix substrate further comprises:
a substrate;
a gate metal layer that is supported by the substrate and includes, out of a first gate electrode, a first source electrode, and a first drain electrode included in the plurality of first TFTs, the first gate electrode, and the plurality of gate bus lines;
a gate insulating layer formed on the gate metal layer;
a source metal layer that is formed on the gate insulating layer and includes the first source electrode, the first drain electrode, and the plurality of source bus lines;
an interlayer insulating layer formed on the source metal layer;
a first transparent conductive layer formed on the interlayer insulating layer;
an inorganic insulating layer formed on the first transparent conductive layer;
a second transparent conductive layer formed on the inorganic insulating layer;
a lower metal layer formed below the gate metal layer; and
a lower insulating layer formed between the gate metal layer and the lower metal layer, wherein the lower metal layer includes a plurality of CS bus lines each extending in the column direction, the plurality of CS bus lines not overlapping the plurality of source bus lines when viewed in a normal direction of the substrate, and wherein each of the plurality of pixels has
a drain extension section that is included in the source metal layer and that extends from the first drain electrode,
a first transparent electrode included in the first transparent conductive layer,
a second transparent electrode that is included in the second transparent conductive layer and is connected to the drain extension section, and
an auxiliary capacitor electrode that includes the lower metal layer and/or the gate metal layer, is electrically connected to at least any one of the plurality of CS bus lines, and overlaps the drain extension section when viewed in the normal direction of the substrate.

2. The active matrix substrate according to claim 1, wherein the plurality of CS bus lines are electrically connected to the first transparent conductive layer.

3. The active matrix substrate according to claim 1, wherein in the lower insulating layer, the gate insulating layer, and the interlayer insulating layer, a plurality of contact holes each reaching any one of the plurality of CS bus lines are formed, and
wherein the first transparent conductive layer is in contact with the plurality of CS bus lines in the plurality of contact holes.

4. The active matrix substrate according to claim 3, wherein the plurality of contact holes include a contact hole formed between the first gate bus line associated with a certain pixel row and the second gate bus line associated with a pixel row adjacent to the certain pixel row.

5. The active matrix substrate according to claim 4, wherein the plurality of contact holes are provided for every n pixel rows (n is an integer) in the column direction and every 2×n pixel columns in the row direction.

6. The active matrix substrate according to claim 1, wherein each of the plurality of pixels further has
a first opening that is formed in the interlayer insulating layer and reaches the drain extension section, and
a second opening that is formed in the inorganic insulating layer and overlaps the first opening when viewed in the normal direction of the substrate, and
wherein the second transparent electrode is in contact with the drain extension section in the first opening.

7. The active matrix substrate according to claim 1, wherein the drain extension section overlaps any one of the plurality of CS bus lines when viewed in the normal direction of the substrate.

8. The active matrix substrate according to claim 1, wherein the auxiliary capacitor electrode and/or the plurality of CS bus lines include the lower metal layer and the gate metal layer, and
wherein in the auxiliary capacitor electrode, a portion that overlaps the drain extension section when viewed in the normal direction of the substrate includes the gate metal layer.

9. The active matrix substrate according to claim 1, wherein the auxiliary capacitor electrode includes the lower metal layer and the gate metal layer,
wherein each of the plurality of pixels further has a third opening that is formed in the lower insulating layer and reaches the lower metal layer of the auxiliary capacitor electrode, and
wherein the gate metal layer of the auxiliary capacitor electrode is formed to cover the third opening.

10. The active matrix substrate according to claim 1, wherein the plurality of CS bus lines include the lower metal layer and the gate metal layer.

11. The active matrix substrate according to claim 1, further comprising a second TFT disposed in a region other than the plurality of pixels,
wherein the second TFT has
a second semiconductor layer formed on the substrate, the lower insulating layer formed on the second semiconductor layer,
a second gate electrode that is included in the gate metal layer and is formed to overlap the second semiconductor layer with the lower insulating layer interposed between the second semiconductor layer and the second gate electrode,
the gate insulating layer covering the second gate electrode, and
a second source electrode and a second drain electrode that are included in the source metal layer and are connected to the second semiconductor layer.

12. The active matrix substrate according to claim 11, wherein the lower metal layer further includes a lower light shielding section formed to cover at least a channel region of the second semiconductor layer when viewed in the normal direction of the substrate.

13. The active matrix substrate according to claim 11, wherein the plurality of first TFTs have a first semiconductor layer formed on the gate insulating layer, the first semiconductor layer includes an oxide semiconductor, and the second semiconductor layer includes crystalline silicon.

14. A liquid crystal display apparatus comprising:
the active matrix substrate according to claim 1;
a counter substrate disposed to be opposite the active matrix substrate; and
a liquid crystal layer provided between the active matrix substrate and the counter substrate.

15. The liquid crystal display apparatus according to claim 14,
wherein the second transparent electrode functions as a pixel electrode, and the counter substrate has a counter electrode opposite the second transparent electrode.

16. The liquid crystal display apparatus according to claim 14,
wherein the second transparent electrode has at least one slit, the second transparent electrode functions as a pixel electrode, and the first transparent electrode functions as a common electrode.

17. The active matrix substrate according to claim 1,
wherein the plurality of CS bus lines extend in parallel with the plurality of source bus lines.

18. The active matrix substrate according to claim 1,
wherein the plurality of CS bus lines extend in the column direction over two or more pixels arranged in the column direction.

19. The active matrix substrate according to claim 6,
wherein each of the plurality of pixels further has a fourth opening that is formed in the first transparent conductive layer and overlaps the first opening when viewed in the normal direction of the substrate, and
wherein the first transparent conductive layer is formed on an entire surface of the substrate other than the fourth opening.

20. The active matrix substrate according to claim 1,
wherein the plurality of CS bus lines does not overlap the second transparent electrode when viewed in a normal direction of the substrate.

\* \* \* \* \*